US011469670B2

(12) United States Patent
Pahkala et al.

(10) Patent No.: US 11,469,670 B2
(45) Date of Patent: Oct. 11, 2022

(54) METHODS AND APPARATUS TO IMPROVE POWER CONVERTER ON-TIME GENERATION

(71) Applicant: Texas Instruments Incorporated, Dallas, TX (US)

(72) Inventors: Janne Matias Pahkala, Oulu (FI); Juha Olavi Hauru, Oulu (FI); Ari Kalevi Väänänen, Oulu (FI)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 295 days.

(21) Appl. No.: 16/904,325

(22) Filed: Jun. 17, 2020

(65) Prior Publication Data
US 2020/0321871 A1    Oct. 8, 2020

Related U.S. Application Data

(63) Continuation of application No. PCT/US2019/051558, filed on Sep. 17, 2019, which is a continuation of application No. 16/134,524, filed on Sep. 18, 2018, now abandoned.

(51) Int. Cl.
*H02M 3/158*    (2006.01)
*G04F 10/00*    (2006.01)
(Continued)

(52) U.S. Cl.
CPC ........ *H02M 3/1582* (2013.01); *G04F 10/005* (2013.01); *H02M 3/157* (2013.01); *H03L 7/0891* (2013.01)

(58) Field of Classification Search
CPC ... H02M 3/1582; H02M 3/157; G04F 10/005; H03L 7/0891
See application file for complete search history.

(56) References Cited
U.S. PATENT DOCUMENTS 3,913,021 A * 10/1975 McCarthy .............. H03K 5/131 331/25
4,049,958 A *  9/1977 Hartmann .............. H03H 11/04 708/820
(Continued)

FOREIGN PATENT DOCUMENTS
JP    6328264 A    5/1988

OTHER PUBLICATIONS

Li et al., "A 90-240 MHz Hysteretic Controlled DC-DC Buck Converter With Digital Phase Locked Loop Synchronization," IEEE Journal of Solid-State Circuits, vol. 46, No. 9, Sep. 2011, 12 pages.
(Continued)

*Primary Examiner* — Adam D Houston
(74) *Attorney, Agent, or Firm* — Michael A. Davis, Jr.; Charles A. Brill; Frank D. Cimino

(57) ABSTRACT

To improve power converter ON-time generation, an example apparatus includes: a phase frequency detector to determine a phase difference between a first signal and a second signal; a first pulse generator to generate a first time signal at a second time, in which the first signal is associated with a first time delay based on the phase difference; and a second pulse generator coupled to the first pulse generator. The second pulse generator is configured to: generate a second time signal at a third time, in which the third time is after the second time; and obtain a digital word based on the phase difference at a first time, in which the first time is before the second time and the third time, and the second time signal is associated with a second time delay based on the phase difference.

20 Claims, 15 Drawing Sheets

(51) Int. Cl.
*H02M 3/157* (2006.01)
*H03L 7/089* (2006.01)

(56) References Cited

U.S. PATENT DOCUMENTS

| | | | |
|---|---|---|---|
| 5,446,416 A | 8/1995 | Lin et al. | |
| 6,008,703 A | 12/1999 | Perrott et al. | |
| 6,060,928 A * | 5/2000 | Jun | G11C 7/222 327/276 |
| 6,100,735 A * | 8/2000 | Lu | H03L 7/0814 331/25 |
| 6,577,695 B1 | 6/2003 | Everitt et al. | |
| 7,027,548 B1 * | 4/2006 | Palusa | H03L 7/0891 327/158 |
| 7,816,960 B2 * | 10/2010 | Saint-Laurent | G04F 10/005 327/158 |
| 8,552,775 B2 | 10/2013 | Lee et al. | |
| 10,199,937 B1 | 2/2019 | Hauru et al. | |
| 10,236,895 B1 | 3/2019 | Rogers et al. | |
| 10,333,403 B2 | 6/2019 | Huang et al. | |
| 11,171,654 B1 * | 11/2021 | Hinrichs | H03L 7/0805 |
| 2003/0080791 A1 * | 5/2003 | Fiscus | H03L 7/087 327/158 |
| 2004/0113667 A1 * | 6/2004 | Jin | H03L 7/0805 327/158 |
| 2008/0122544 A1 | 5/2008 | Wang | |
| 2008/0197830 A1 | 8/2008 | Mehas et al. | |
| 2008/0297214 A1 * | 12/2008 | Easwaran | H03L 7/0891 327/157 |
| 2009/0256601 A1 | 10/2009 | Zhang et al. | |
| 2014/0184180 A1 | 7/2014 | Kronmueller | |
| 2015/0280556 A1 | 10/2015 | Bari et al. | |
| 2016/0118967 A1 * | 4/2016 | Krishnamurthy | H03K 7/08 327/158 |
| 2016/0336848 A1 | 11/2016 | Meola et al. | |
| 2019/0011945 A1 * | 1/2019 | Fayneh | G06F 1/06 |
| 2020/0321871 A1 * | 10/2020 | Pahkala | H02M 3/1582 |
| 2021/0208621 A1 * | 7/2021 | Chiang | H03L 7/1976 |
| 2021/0216046 A1 * | 7/2021 | Huggett | G04F 10/005 |
| 2021/0247722 A1 * | 8/2021 | Cohen | H03M 1/504 |
| 2021/0302550 A1 * | 9/2021 | Dutton | G01S 17/89 |

OTHER PUBLICATIONS

Krishnamurthy et al., "A 500 MHz, 68% efficient, Fully On-Die Digitally Controlled Buck Voltage Regulator on 22nm Tri-Gate CMOS," 2014 Symposium on VLSI Circuits Digest of Technical Papers, Jun. 2014, 2 pages.

Krishnamurthy et al.,"A Digitally Controlled Fully Integrated Voltage Regulator With 3-D-TSV-Based On-Die Solenoid Inductor With a Planar Magnetic Core for 3-D-Stacked Die Applications in 14-nm Tri-Gate CMOS," IEEE Journal of Solid-State Circuits, 2017, 11 pages.

International Search Report for PCT/US19/51558, dated Dec. 5, 2019, 1 page.

David K. Morgan, CD4046B Phase-Locked Loop: A Versatile Building Block for Micropower Digital and Analog Applications. Standard Linear & Logic, Feb. 2003.

PCT International Search Report dated Oct. 21, 2021.

* cited by examiner

US 11,469,670 B2

METHODS AND APPARATUS TO IMPROVE POWER CONVERTER ON-TIME GENERATION

CROSS-REFERENCE TO RELATED APPLICATIONS

This application is a continuation of (and claims priority to) PCT Patent Application No. PCT/US2019/051558 filed Sep. 17, 2019, which is continuation of (and claims priority to) U.S. patent application Ser. No. 16/134,524 filed Sep. 18, 2018, the entireties of which are incorporated herein by reference.

BACKGROUND

This relates generally to power converters, and more particularly to methods and apparatus to improve power converter ON-time generation.

A power converter is a circuit that is used in various devices to convert an input voltage to a desired output voltage. For example, a buck converter converts an input voltage into a lower output voltage by controlling transistors and/or switches to charge and/or discharge inductors and/or capacitors to maintain the desired output voltage. Buck converters may be used in automotive applications to reduce an input voltage to an output voltage when the input voltage rises above the output voltage due to alternator operation or other voltage spike inducing events.

DETAILED DESCRIPTION OF EXAMPLE EMBODIMENTS

Figure 1:
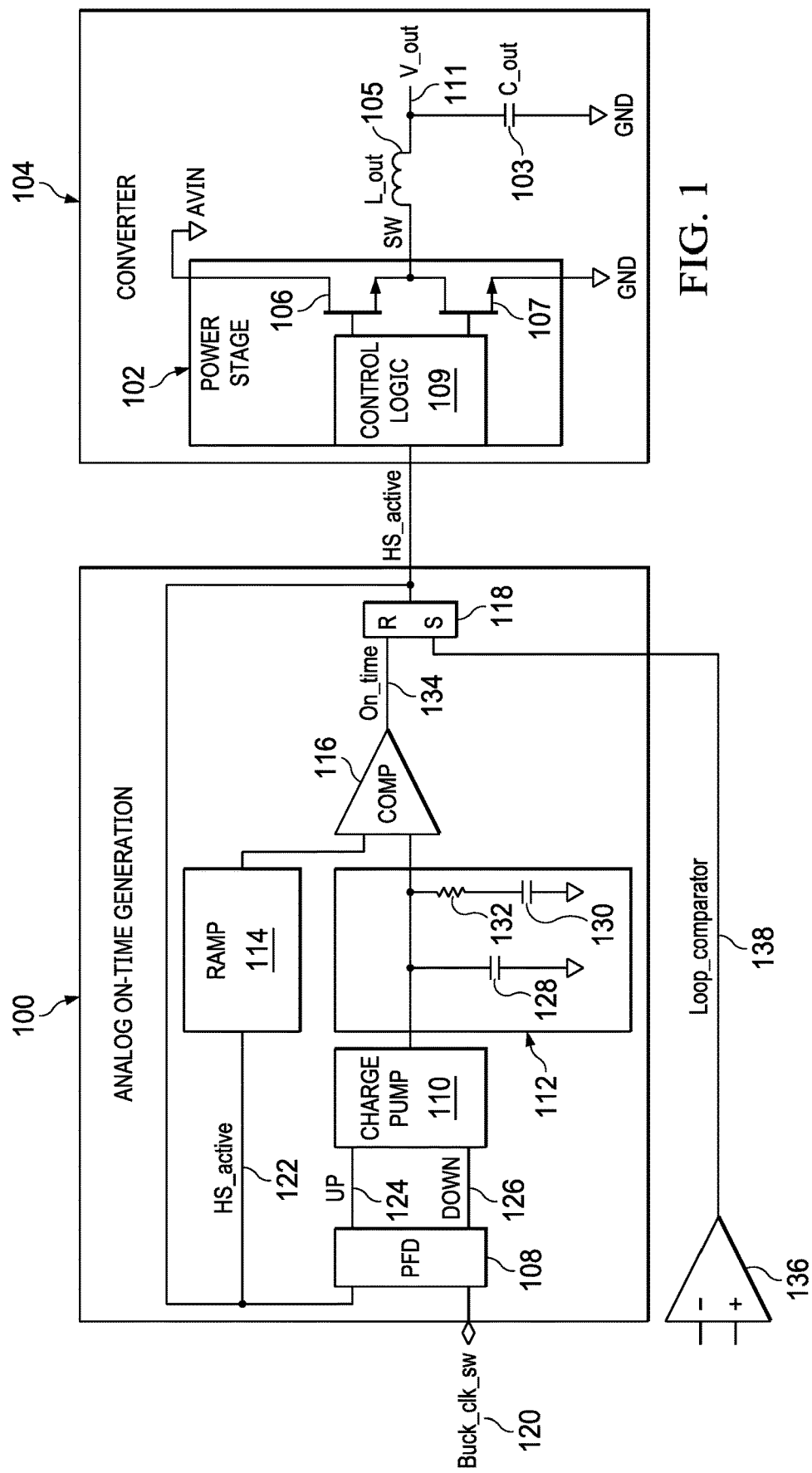
FIG. 1 is a schematic illustration of a typical analog ON-time generation system.

The drawings are not to scale. Generally, the same reference numbers are used throughout the drawing(s) and this description to refer to the same or like parts.

Switched mode power converters (e.g., boost converters, buck converters, buck-boost converters, etc.) are used to convert a first voltage (e.g., an input voltage) to a second voltage (e.g., an output voltage). Such power converters include a switching network including one or more switching transistors coupled to a switching node that is switched to form circuit arrangements to direct current through an energy storage inductor and/or to charge/discharge an output capacitor. Such circuit arrangements supply load current and regulate the output voltage to remain substantially steady at the second voltage. The switching network can include one or more drivers coupled (e.g., directly or indirectly) to the control terminals of switching (power) transistors, such as the gates of bipolar junction transistors (BJTs) or metal oxide semiconductor field effect transistors (MOSFETs) (e.g., P-Channel MOSFETs, N-Channel MOSFETs, etc.).

Typical buck converters are efficient in maintaining an output voltage at low switching frequencies, but efficiency decreases with an increase in switching frequency. For example, switching loss is proportional to switching frequency. In such examples, a maximum conversion ratio is lower, a dropout voltage is higher, and current limit accuracy decreases in response to an increase in switching frequency. In some typical buck converter implementations, synchronization of the buck converter regulator to an external clock can maintain the EMI generated within the system to a predictable set of frequencies.

In some typical buck converters, the external clock synchronization is implemented with an analog adaptive ON-time generation architecture. The analog architecture synchronizes the buck converter regulator with the external clock by adapting the ON-time of the high-side switch (e.g., a power transistor on a primary side of a transformer) coupled to the buck converter. In such implementations, the buck converter requires generating relatively short periods of ON-time for high-side transistors for relatively high-switching frequency operation (e.g., 10 megahertz (MHz), 15 MHz, etc.). For example, the ON-time may be approximately 10 nanoseconds (ns) due to operational limitations of analog components included in the analog architecture. A typical analog implementation cannot reduce the ON-time to significantly lower than 10 ns (e.g., an ON-time of 4 ns, 6 ns, etc.). Further, the typical analog implementation can result in ON-time jitter and unstable operation of the buck converter control loop. Moreover, the analog implementation results in generating and consuming relatively high quiescent current when generating the relatively fast control signals.

Examples described herein provide improvements to power converter operation by facilitating low-latency digital adaptive ON-time and/or OFF-time generation for power converters (e.g., buck converters). Advantageously, examples described herein generate the ON-time for the high-side switch (e.g., a high-side period) using a digital implementation (e.g., a fully-digital implementation), where the current leakage is digital current leakage (e.g., only digital current leakage). In some described examples, the digital implementation includes relatively low-latency startup times (e.g., no startup time, a negligible duration of startup time, etc.). Examples described herein generate the ON-time for the low-side switch (e.g., a low-side period) using the digital implementation, which is sometimes referred to as the OFF-time for the high-side switch.

In some described examples, the switching of a transistor (e.g., the high-side switch, the low-side switch, etc.) included in the power converter is synchronized to a reference clock (e.g., an external clock) by adapting the ON-time with an all-digital and/or otherwise substantially digital phase locked loop (PLL). Advantageously, examples described herein achieve a relatively fast response to phase error without a gigahertz (GHz) frequency clock by including two or more pulse generators in series. In some described examples, at least one of the two or more pulse generators are controlled asynchronously. For example, the asynchronously controlled pulse generator(s) can adapt a relatively small portion (e.g., 200 picoseconds (ps), 500 ps, etc.) of the high-side switch ON-time (e.g., 4 ns, 6 ns, etc.) based on the phase error in the beginning of the high-side period (HS period), or the time during which the high-side switch is ON and/or otherwise in the enabled state. Advantageously, examples described herein facilitate improved high-frequency switching of power converters such as buck converters while minimizing and/or otherwise reducing the ON-time jitter and, further, while achieving stable operation of the buck converter control loop compared to typical analog implementations. Additionally or alternatively, the examples described herein may apply to the low-side switch of the power converter.

FIG. 1 is a schematic illustration of a typical analog ON-time generation (OTG) system 100. The analog OTG system 100 is an integrated circuit. The analog OTG system 100 is coupled to a power stage 102 included in a converter 104. The converter 104 includes a capacitor (C_out) 103 and an inductor (L_out) 105 to generate and/or otherwise maintain an output voltage (V_out) 111 (e.g., a desired output voltage). In FIG. 1, the converter 104 is a buck converter. The analog OTG system 100 controls a length of a HS period (e.g., a HS length), or a time during which a high-side switch 106 included in the power stage 102 is ON and/or otherwise enabled. Further included in the power stage 102 is a low-side switch 107 coupled to the high-side switch 106 and control logic 109. In FIG. 1, the analog OTG system 100 includes a phase frequency detector (PFD) 108, a charge pump 110, a loop filter 112, a ramp 114, a first comparator 116, and a latch 118. For example, the latch 118 is a level sensitive SR latch.

In FIG. 1, the PFD 108 measures and/or otherwise determines a phase difference between a first rising edge of a reference clock signal (Buck_clk_sw) 120 and a second rising edge of a high-side signal (HS_active) 122. The reference clock signal 120 is obtained from an external clock or a reference clock. The HS signal 122 operates and/or otherwise switches ON the high-side switch 106 when the HS signal 122 is high (e.g., a signal corresponding to a digital 1, a high voltage, etc.). In response to switching the high-side switch 106 ON, the converter 104 performs a voltage conversion operation. The PFD 108 generates and transmits an up signal 124 and/or a down signal 126 based on the phase difference to the charge pump 110. For example, a function of the PFD 108 includes transmitting the up signal 124 and/or the down signal 126 to the charge pump 110. The up signal 124 can correspond to a signal generated by the PFD 108 when a frequency of the HS signal 122 is greater than a frequency of the reference clock signal 120. The down signal 126 can correspond to a signal generated by the PFD 108 when the frequency of the HS signal 122 is less than the frequency of the reference clock signal 120. The charge pump 110 of FIG. 1 is a current sink and source that can sink current or source current to the loop filter 112 to generate a reference voltage for the first comparator 116.

In FIG. 1, the loop filter 112 includes a first capacitor 128 and a second capacitor 130, where the second capacitor is coupled in series with a resistor 132. The loop filter 112 generates a reference voltage that sets the reference level of ON-time for the first comparator 116. The resistor 132 included in the loop filter 112 defines the proportional term of PLL, which can control the HS length during the HS period. For example, the voltage stored in the first capacitor 128 and the second capacitor 130 define a delay of the ON time for the high-side switch.

In operation, a beginning or an initialization of a HS period of the high-side switch 106 occurs at a first time. For example, the beginning of the HS period can occur in response to a rising edge of the HS signal 122. At the first time, the HS signal 122 triggers the ramp 114 to generate a voltage ramp (e.g., a voltage increasing with time). At a second time later than the first time, the voltage ramp input at the first comparator 116 becomes greater than the reference voltage input provided by the loop filter 112. At the second time, the first comparator 116 is triggered and generates a reset signal (On_time) 134 to enable the latch 118 to reset the HS signal 122. The first comparator 116 ends the HS period at the second time to begin and/or otherwise initialize a low-side (LS) period. At a third time later than the second time, a second comparator 136 generates and transmits a set signal (Loop_comparator) 138 to the latch 118 to begin another HS period of the high-side switch.

The analog OTG system 100 of FIG. 1 is not suitable for high-frequency switching (e.g., 10 MHz, 15 MHz, etc.) due to the first comparator 116 consuming a relatively large quantity of current and corresponding delay and startup times. For example, an increased voltage stored in the first capacitor 128 and the second capacitor 130 can lead to an increased quantity of time for the ramp 114 to generate a ramp voltage to trigger the first comparator 116. In other examples, the first capacitor 128 and/or the second capacitor 130 can leak voltage causing the first comparator 116 to be prematurely triggered.

Figure 2:
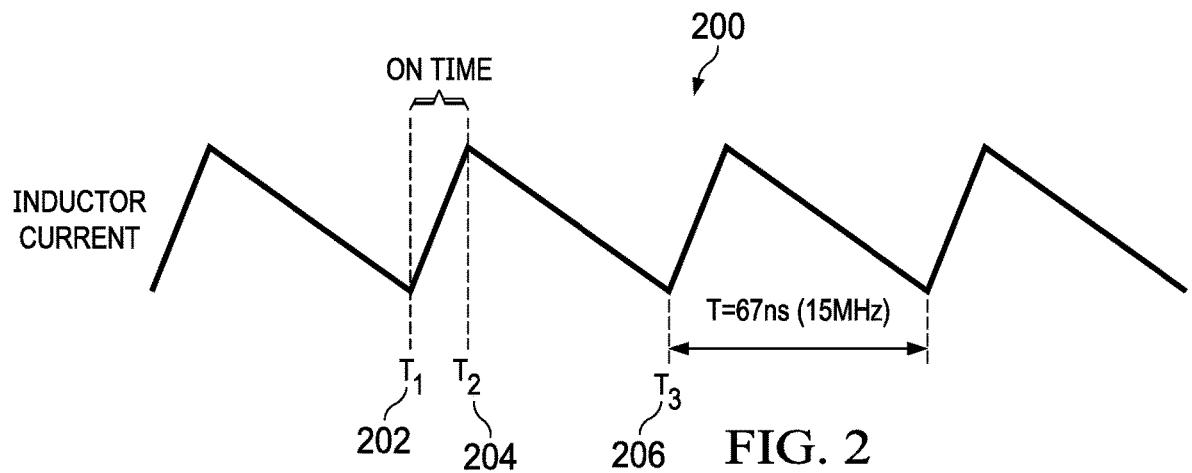
FIG. 2 is a typical timing diagram corresponding to operation of the analog ON-time generation system of FIG. 1.

FIG. 2 is a typical timing diagram 200 corresponding to operation of the analog OTG system 100 of FIG. 1. Prior to a first time (T1) 202, the first comparator 116 of FIG. 1 generates a high signal for the reset signal 134 to trigger the latch 118 to enter a stable low state (e.g., reset the latch 118). In response to the latch 118 entering the stable low state, the latch 118 outputs a low signal for the HS signal 122 which, in turn, resets the ramp 114. At the first time 202, the second comparator 136 sets the latch 118 to generate a high signal for the HS signal 122. The HS signal 122 at the first time 202 turns on the high-side switch 106 and triggers the ramp 114 to generate a ramp voltage. From the first time 202 until a second time (T2) 204, the ramp 114 is generating the ramp voltage while (inductor) current is building and/or otherwise increasing in an inductor included in the converter 104 of FIG. 1. At the second time 204, the ramp voltage becomes greater than the reference voltage of the loop filter 112, which in turn triggers the first comparator 116 to generate the reset signal 134. The HS period of FIG. 2 is represented by the time duration spanning the first time 202 and the second time 204.

In the timing diagram 200 of FIG. 2, from the second time 204 until a third time (T3) 206, the HS signal 122 is low and causes the high-side switch 106 to remain off and, thus, causes the inductor current to approach a quantity of inductor current proximate to the quantity of inductor current at the first time 202. The LS period of FIG. 2 is represented by the time duration spanning the second time 204 and the third time 206. In the timing diagram 200 of FIG. 2, a time duration of one switch operation of the power stage 102 of FIG. 1 that includes the HS period and the LS period is 67 ns. In FIG. 2, the on-time of the high-side switch 106 corresponds to approximately 10 ns of the 67 ns. For example, 67 ns corresponds to a switching frequency of 15 MHz. The analog OTG system 100 of FIG. 1 may not be able to provide lower on-times than 10 ns and, thus, may not be able to provide higher switching frequencies due to structural and/or functional limitations of the components included in the analog OTG system 100.

Figure 3:
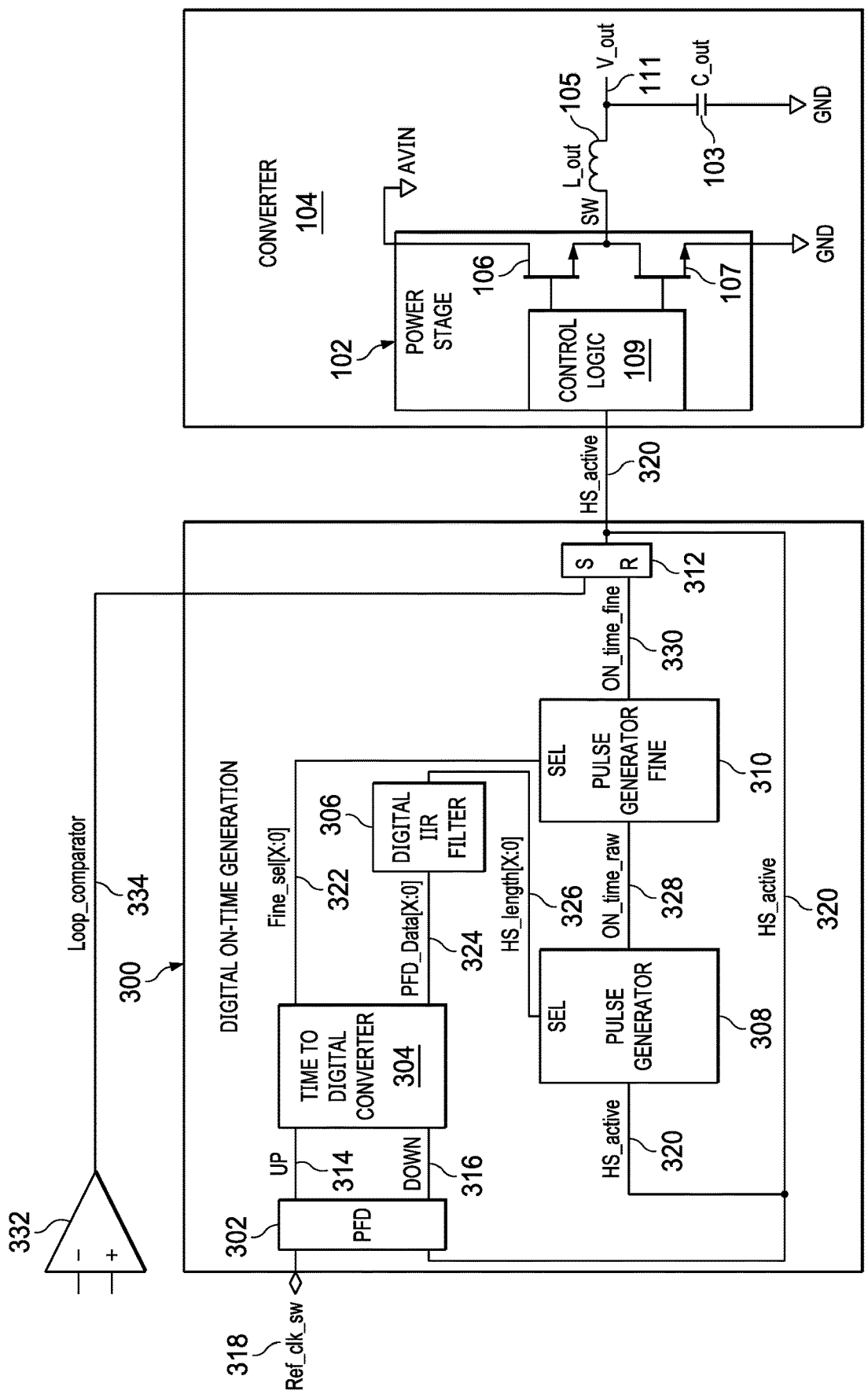
FIG. 3 is a schematic illustration of an example digital ON-time generation system to implement the examples described herein.

FIG. 3 is a schematic illustration of an example digital OTG system 300 to implement the examples described herein. The digital OTG system 300 of FIG. 3 is an integrated circuit (IC) (e.g., a controller, a hardware controller, etc.). In some examples, the digital OTG system 300 includes one or more ICs. Alternatively, the digital OTG system 300 may be implemented using hardware logic, machine readable instructions, hardware implemented state machines, and/or any combination thereof. The digital OTG system 300 can generate reduced ON-times for the high-side switch 106 and, thus, increase a frequency of switching operations compared to the analog OTG system 100 of FIG. 1. Advantageously, the digital OTG system 300 can minimize and/or otherwise reduce the ON-time jitter and achieve stable operation of the control loop of the converter 104 of FIG. 1 compared to the analog OTG system 100. The digital OTG system 300 can start up from pulse frequency modulation (PFM) in a relatively short period (e.g., 4 ns, 6 ns, etc.) to respond to load transients and consumes less current during low power PFM regulation compared to the analog OTG system 100. The digital OTG system 300 of FIG. 3 includes an example PFD 302, an example time-to-digital (TTD) converter 304, an example digital filter (e.g., a digital infinite impulse response (IIR) filter) 306, a first example pulse generator 308, a second example pulse generator (Pulse Generator Fine) 310, and an example latch 312.

In the illustrated example of FIG. 3, the PFD 302 is an IC. Alternatively, the PFD 302 may be implemented using hardware logic, machine readable instructions, hardware implemented state machines, and/or any combination thereof. In FIG. 3, the PFD 302 generates a first example signal 314 and a second example signal 316. The first signal 314 of FIG. 1 is an up signal and the second signal 316 is a down signal. The up signal 314 and the down signal 316 correspond to pulse lengths. For example, the PFD 302 can generate the up signal 314 when an example reference clock signal (Ref_clk_sw) 318 has a frequency that is greater than a frequency of an example HS signal (HS_active) 320. The pulse length of the up signal 314 is proportional to the frequency difference. In such examples, the up signal 314 can correspond to a negative current source. In other examples, the PFD 302 can generate the down signal 316 when the frequency of the reference clock signal 318 is less than the frequency of the HS signal 320. The pulse length of the down signal 316 is proportional to the frequency difference. In such examples, the down signal 316 can correspond to a positive current source.

In the illustrated example of FIG. 3, the PFD 302 generates and transmits the up signal 314 or the down signal 316 to the TTD converter 304. For example, the PFD 302 is capable of transmitting the up signal 314 or the down signal 316 to the TTD converter 304. The TTD converter 304 of FIG. 3 is an IC. Alternatively, the TTD converter 304 may be implemented using hardware logic, machine readable instructions, hardware implemented state machines, and/or any combination thereof. The TTD converter 304 measures the pulse lengths of the up signal 314 or the down signal 316 and converts the pulse lengths to one or more example digital words (e.g., one or more digital values, one or more byte values, etc.). The TTD converter 304 converts and/or otherwise asynchronously translates the pulse lengths with corresponding delay cells included in the TTD converter 304 as described below in accordance with FIG. 8A. Advantageously, the TTD converter 304 generates the one or more digital words to facilitate low-latency digital operation of the digital OTG system 300 compared to the analog OTG system 100 of FIG. 1.

The one or more digital words of FIG. 3 include a first example digital word (Fine_sel[X:0]) 322 and a second example digital word (PFD_Data[X:0]) 324. In FIG. 3, the first digital word 322 is a first delay adjustment word (e.g., a first delay adjustment digital word). In some examples, the delay adjustment digital word includes one or more digital words. In FIG. 3, the second digital word 324 is a second delay adjustment word (e.g., a second delay adjustment digital word). In some examples, the second delay adjustment digital word includes one or more digital words. The first digital word 322 is transmitted to the second pulse generator 310 to adaptively control a small portion or a fine tuning portion of the ON-time at the end of the corresponding HS period. The second digital word 324 is transmitted to the digital filter 306 to generate an example HS length (HS_length[X:0]) 326. For example, the TTD converter 304 is capable of transmitting the first digital word 322 to the second pulse generator 310 and/or transmitting the second digital word 324 to the digital filter 306.

In the illustrated example of FIG. 3, the digital filter 306 is an IC. Although the digital filter 306 of FIG. 3 is and/or otherwise implements a digital IIR filter, the digital filter 306 may be a different type of digital filter and/or include more than one digital filter. Alternatively, the digital filter 306 may be implemented using hardware logic, machine readable instructions, hardware implemented state machines, and/or any combination thereof. In FIG. 3, the digital filter 306 generates the HS length 326 based on the second digital word 324 obtained from the TTD converter 304. Advantageously, the digital filter 306 generates the HS length 326 to facilitate low-latency digital operation of the digital OTG system 300 compared to the analog OTG system 100 of FIG. 1. The digital filter 306 filters the second digital word 324 and outputs the corresponding HS length 326 to the first pulse generator 308. For example, the digital filter 306 may process the second digital word 324 associated with the phase difference detected by the PFD 302 and generate a filtered phase difference by filtering the second digital word 324. The HS length 326 corresponds to a digital value (e.g., one or more bytes) that represents a quantity of time to switch ON the high-side switch 106 of FIG. 1. In other examples, the HS length 326 may correspond to a digital value (e.g., one or more bytes) that represents a quantity of time to switch ON the low-side switch 107 of FIG. 1.

In the illustrated example of FIG. 3, the first pulse generator 308 is an IC. Alternatively, the first pulse generator 308 may be implemented using hardware logic, machine readable instructions, hardware implemented state machines, and/or any combination thereof. In FIG. 3, the first pulse generator 308 generates a signal corresponding to a delay of a reset of the latch 312. Advantageously, the first pulse generator 308 generates the signal to facilitate low-latency digital operation of the digital OTG system 300 compared to higher-latency operation of the analog OTG system 100 of FIG. 1. By delaying the reset of the latch 312, the first pulse generator 308 and/or, more generally, the digital OTG system 300 delays the transition of the converter 104 from the HS period to the LS period. The latch 312 of FIG. 3 is a level sensitive latch. Alternatively, other types of flip-flops or latches may be used for the latch 312 of FIG. 3.

In FIG. 3, the first pulse generator 308 transforms and/or otherwise converts the HS length 326 from the digital filter 306 to a first example time signal (ON time raw) 328 at the beginning of a HS period. The first time signal 328 corresponds to a first time component, or a first pulse length, of the HS signal 320. For example, the first time signal 328 can correspond to a quantity of a time delay (e.g., a pulse delay), during which the high-side switch 106 is ON. In such examples, the first time signal 328 can correspond to a high-side signal (e.g., a high-side instruction, a high-side command, etc.). In other examples, the first time signal 328 can correspond to a quantity of the time delay (e.g., the pulse delay), during which the low-side switch 107 is ON. In such examples, the first time signal 328 can correspond to a low-side signal (e.g., a low-side instruction, a low-side command, etc.). In FIG. 3, the first pulse generator 308 is triggered with a rising edge of the HS signal 320. The first pulse generator 308 latches the first time signal 328 to an output of the first pulse generator 308 after a delay has expired, where the delay is digitally controlled by the first pulse generator 308.

The digital phase error synchronization in the TTD converter 304 and the digital filter 306 can take multiple clock cycles. In an example power management process, a delay of multiple clock cycles can be too long to adapt the ongoing ON-time of the high-side switch 106. In some instances, the ON-time control loop of the converter 104 becomes unstable if there is not a relatively fast enough path to the ON-time adaptation. The digital OTG system 300 of FIG. 3 provides the relatively fast enough path by coupling the second pulse generator 310 in series with the first pulse generator 308, where the second pulse generator 310 generates a delay via asynchronous control.

In the illustrated example of FIG. 3, the second pulse generator 310 is an IC. Alternatively, the second pulse generator 310 may be implemented using hardware logic, machine readable instructions, hardware implemented state machines, and/or any combination thereof. In FIG. 3, the second pulse generator 310 adapts a relatively small portion of the ON-time at the end of the HS period. Advantageously, the second pulse generator 310 adapts the relatively small portion of the ON-time to facilitate low-latency digital operation of the digital OTG system 300 compared to higher-latency operation of the analog OTG system 100 of FIG. 1. In response to the TTD converter 304 converting the pulse lengths of the up signal 314 and/or the down signal 316 into the first digital word 322 and the second digital word 324, the second pulse generator 310 can determine an adaptive delay to add to the first time component corresponding to the first time signal 328. For example, the second pulse generator 310 can determine the adaptive delay while the TTD converter 304 and the digital filter 306 function. The second pulse generator 310 of FIG. 3 can add the adaptive delay to the first time signal 328 to generate a second example time signal (ON_time_fine) 330.

In FIG. 3, the second pulse generator 310 transmits the second time signal 330 to the latch 312 to reset the latch 312 and, thus, end the HS period. For example, the second pulse generator 310 can reset the latch 312 in response to a rising edge of the second time signal 330. In response to resetting the latch 312, an example loop comparator 332 generates an example loop comparator signal (Loop_comparator) 334 to set the latch 312 and trigger the HS period via the HS signal 320. In response to setting the latch 312, the high-side switch 106 is switched ON for a time corresponding to the length of the first time signal 328 and the second time signal 330. In other examples, in response to setting the latch 312, the low-side switch 107 is switched ON for the time corresponding to the length of the first time signal 328 and the second time signal 330.

While an example manner of implementing the digital OTG system 300 is illustrated in FIG. 3, one or more of the elements, processes, and/or devices illustrated in FIG. 3 may be combined, divided, re-arranged, omitted, eliminated, and/or implemented in any other way. Further, the example PFD 302, the example TTD converter 304, the example digital filter 306, the first example pulse generator 308, the second example pulse generator 310, the example latch 312, and/or, more generally, the example digital OTG system 300 of FIG. 3 may be implemented by hardware, software, firmware, and/or any combination of hardware, software, and/or firmware. Thus, for example, any of the example PFD 302, the example TTD converter 304, the example digital filter 306, the first example pulse generator 308, the second example pulse generator 310, the example latch 312, and/or, more generally, the example digital OTG system 300 could be implemented by one or more analog or digital circuit(s), logic circuits, programmable processor(s), programmable controller(s), graphics processing unit(s) (GPU(s)), digital signal processor(s) (DSP(s)), application specific integrated circuit(s) (ASIC(s)), programmable logic device(s) (PLD(s)), and/or field programmable logic device(s) (FPLD(s)). When reading any of the apparatus or system claims of this patent to cover a purely software and/or firmware implementation, at least one of the example PFD 302, the example TTD converter 304, the example digital filter 306, the first example pulse generator 308, the second example pulse generator 310, and/or the example latch 312 is/are hereby expressly defined to include a non-transitory computer readable storage device or storage disk such as a memory, a digital versatile disk (DVD), a compact disk (CD), a Blu-ray disk, etc., including the software and/or firmware. Further still, the example digital OTG system 300 of FIG. 3 may include one or more elements, processes, and/or devices in addition to, or instead of, those illustrated in FIG. 3, and/or may include more than one of any or all of the illustrated elements, processes, and devices. As used herein, the phrase "in communication," including variations thereof, encompasses direct communication and/or indirect communication through one or more intermediary components, and does not require direct physical (e.g., wired) communication and/or constant communication, but rather additionally includes selective communication at periodic intervals, scheduled intervals, aperiodic intervals, and/or one-time events.

Figure 4:
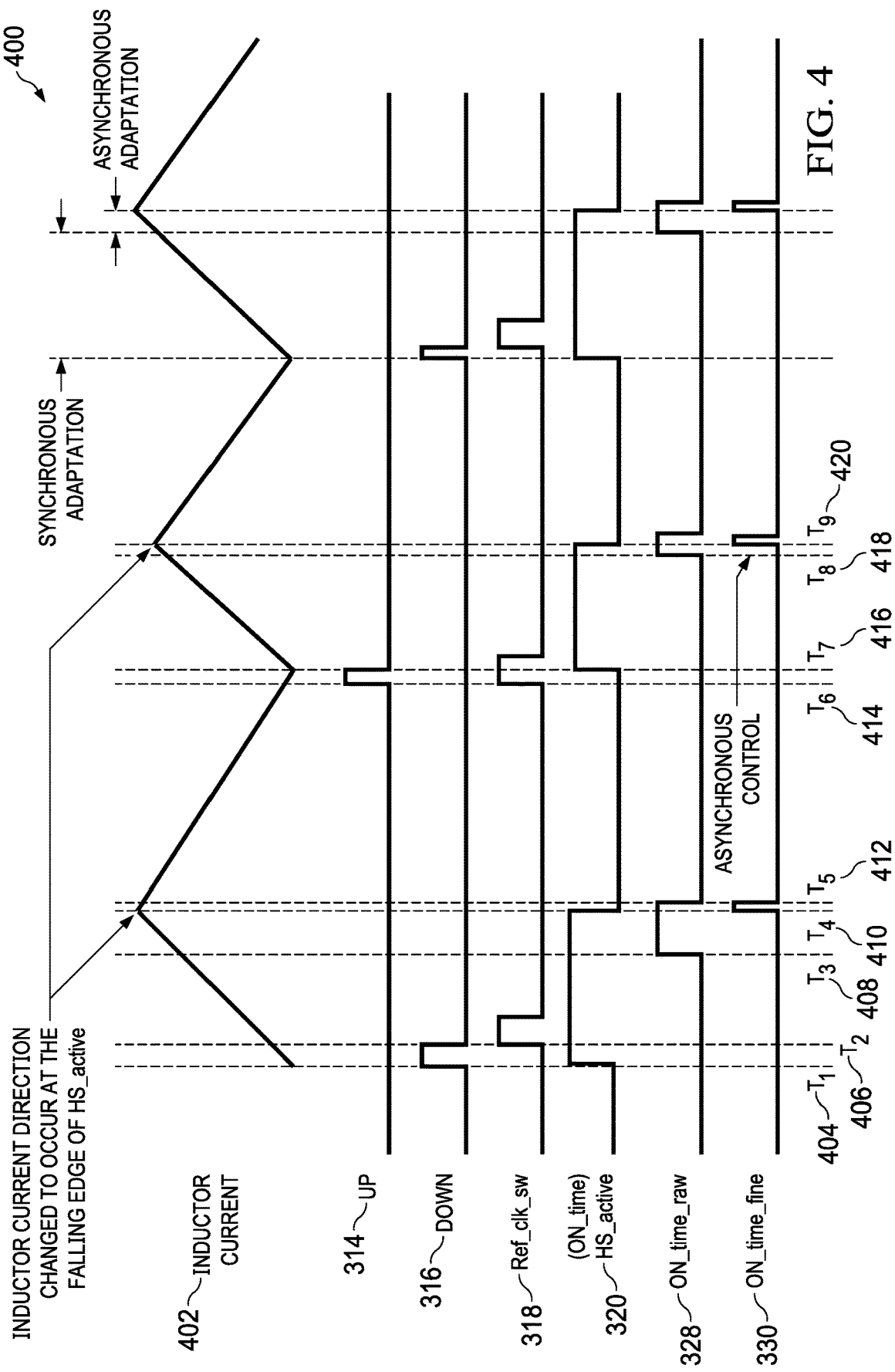
FIG. 4 is an example timing diagram corresponding to operation of the example digital ON-time generation system of FIG. 3.

FIG. 4 is an example timing diagram 400 corresponding to operation of the digital OTG system 300 of FIG. 3. The timing diagram 400 of FIG. 4 depicts an example waveform for an example inductor current 402 corresponding to current flowing through the inductor 105 included in the converter 104 of FIG. 1. The timing diagram 400 of FIG. 4 includes the first signal (Up) 314, the second signal (Down) 316, the reference clock signal (Ref_clk_sw) 318, the HS signal (HS_active) 320, the first time signal (ON_time raw) 328, and the second time signal (ON_time_fine) 330 of FIG. 3.

In the illustrated example of FIG. 4, at a first example time (T1) 404, the loop comparator 332 of FIG. 3 generates and transmits the loop comparator signal 334 of FIG. 3 to the set terminal of the latch 312 to set and/or otherwise latch the loop comparator signal 334 to an output of the latch 312 to generate the HS signal 320. In response to setting the latch 312, the HS signal 320 is transmitted to the power stage 102 to turn on the high-side switch 106 of FIG. 1. In response to turning on the high-side switch 106 at the first time 404, the converter 104 of FIG. 1 begins a HS period. In other examples, in response to setting the latch 312, the HS signal 320 is transmitted to the power stage 102 to turn ON the low-side switch 107 of FIG. 1. In response to turning on the low-side switch 107 at the first time 404, the converter 104 of FIG. 1 may begin a low-side period. In examples where the HS signal 320 turns on the high-side switch 106, the inductor current 402 begins to build and/or otherwise increase a quantity of stored energy in the inductor 105. At the first time 404, the HS signal 320 is transmitted from an output of the latch 312 to an input of the first pulse generator 308, which in turn generates and transmits the first time signal 328 to the second pulse generator 310.

At the first time 404, the PFD 302 of FIG. 3 generates the down signal 316 based on a comparison of the reference clock signal 318 and the HS signal 320. At the first time 404, the reference clock signal 318 is low while the HS signal 320 is high. In response to determining that the HS signal 320 is high prior to the reference clock signal 318 being high, the PFD 302 generates the down signal 316. For example, the PFD 302 can determine that a frequency of the HS signal 320 is greater than a frequency of the reference clock signal 318 based on the comparison.

In the timing diagram 400 of FIG. 4, the PFD 302 generates the down signal 316 with a pulse length having a size (e.g., a width, a pulse width, etc.) and/or a duration based on the comparison. For example, the pulse length can be associated with a quantity of time that the HS signal 320 is high while the reference clock signal 318 is not high. For example, the pulse length of the down signal 316 can correspond to a time duration beginning with the first time 404 up until a second example time 406 when the reference clock signal 318 is pulled and/or otherwise set high.

In the illustrated example of FIG. 4, the first pulse generator 308 generates the first time signal 328 from a third example time (T3) 408 until a fifth example time (T5) 412. The second pulse generator 310 generates the second time signal 330 from a fourth example time (T4) 410 until the fifth time 412. The time duration from the first time 404 until the third time 408 corresponds to a synchronous time delay in ending the high-side period of the converter 104, where the synchronous time delay is based on the first time signal 328. The time duration from the third time 408 until the fourth time 410 corresponds to an asynchronous time delay in ending the high-side period of the converter 104, where the asynchronous time delay is based on the second time signal 330. For example, a rising edge of the second time signal 330 ends the HS period by pulling the HS signal 320 low.

In connection with the timing diagram 400 of FIG. 4, the PFD 302 determines that the HS signal 320 is out-of-phase with the reference clock signal 318 at the first time 404. The TTD converter 304 of FIG. 3 receives the down signal 316 from the PFD 302 and transmits the first digital word 322 of FIG. 3 to the second pulse generator 310. The TTD converter 304 transmits the second digital word 324 to the digital filter 306. The digital filter 306 transmits the HS length 326 to the first pulse generator 308 based on processing the second digital word 324. For example, the TTD converter 304 may transmit the first digital word 322 to the second pulse generator 310 during which the first pulse generator 308 (synchronously) generates the first time signal 328. For example, the length of the delay associated with the first time signal 328 is controlled synchronously with receiving the HS_length 326 from the digital filter 306. In such examples, the first pulse generator 308 generates the delay that is associated with the first time signal 308 in response to a rising edge of the HS signal 320. At the fourth time 410, the digital OTG system 300 of FIG. 3 asynchronously triggers the second pulse generator 310 to generate the second time signal 330 corresponding to an end of the asynchronous time delay.

In the timing diagram 400 of FIG. 4, at a sixth example time (T6) 414, the PFD 302 generates the up signal 314 based on detecting a phase difference between the reference clock signal 318 and the HS signal 320. For example, in response to the adaptive time delay corresponding to the second time signal 330 beginning at the third time 408 until the fourth time 410, the reference clock signal 318 goes high prior to the HS signal 320 at the sixth time 414. For example, the reference clock signal 318 has a higher frequency than the HS signal 320. The PFD 302 generates the up signal 314 with a pulse delay corresponding to a time duration beginning with the sixth time 414 until a seventh example time (T7) 416, when the HS signal 320 goes high. In response to detecting the phase difference, the TTD converter 304 generates and transmits the first digital word 322 to the second pulse generator 310 to generate the second time signal 330, where the rising edge of the second time signal 330 ends the HS period of the converter 104 by pulling the HS signal 320 low.

In the illustrated example of FIG. 4, the delay between a first rising edge of the first time signal 328 at the third time 408 and a second rising edge of the second time signal 330 at the fourth time 410 is asynchronously controlled by the digital OTG system 300 based on the first signal 314 or the second signal 316. For example, the pulse length associated with the first signal 314 at the sixth time 414 until the seventh time 416 may correspond to the delay between the first and second rising edges. In such examples, the first digital word 322 can be updated based on the pulse length of the first signal 314 or the second signal 316, which, in turn, affects the delay generated by the second pulse generator 310 (e.g., the delay from the third time 408 until the fourth time 410, the delay from the eighth time 418 until the ninth time 420, etc.).

In the timing diagram of FIG. 4, the digital OTG system 300 digitally controls the ON-time of the high-side switch 106 and/or, more generally, the converter 104. For example, the digital OTG system 300 digitally controls the ON-time of the converter 104 as depicted from the inductor current 402 rising from the first time 404 until the fourth time 410, from the seventh time 416 until the ninth time 420 (i.e., corresponding to the rising edge of the second time signal 330), etc. The digital OTG system 300 digitally controls the ON-time based on a synchronous adaptation and/or an asynchronous adaptation. For example, the digital OTG system 300 can synchronously adapt the ON-time from the first time 404 until the third time 408 and asynchronously adapt the ON-time from the third time 408 until the fourth time 410. For example, the first pulse generator 308 can synchronously generate a first delay associated with the first time signal 328 in response to receiving the HS signal 320 and the HS length 326. In such examples, the second pulse generator 310 can asynchronously generate a second delay associated with the second time signal 330 in response to the phase difference detected by the PFD 302 based on the first digital word 322 generated by the TTD converter 304. When the second pulse generator 310 ends the second delay by generating the second time signal 330, the inductor current 402 begins to decrease due to the end of the HS period of the converter 104.

Figure 5:
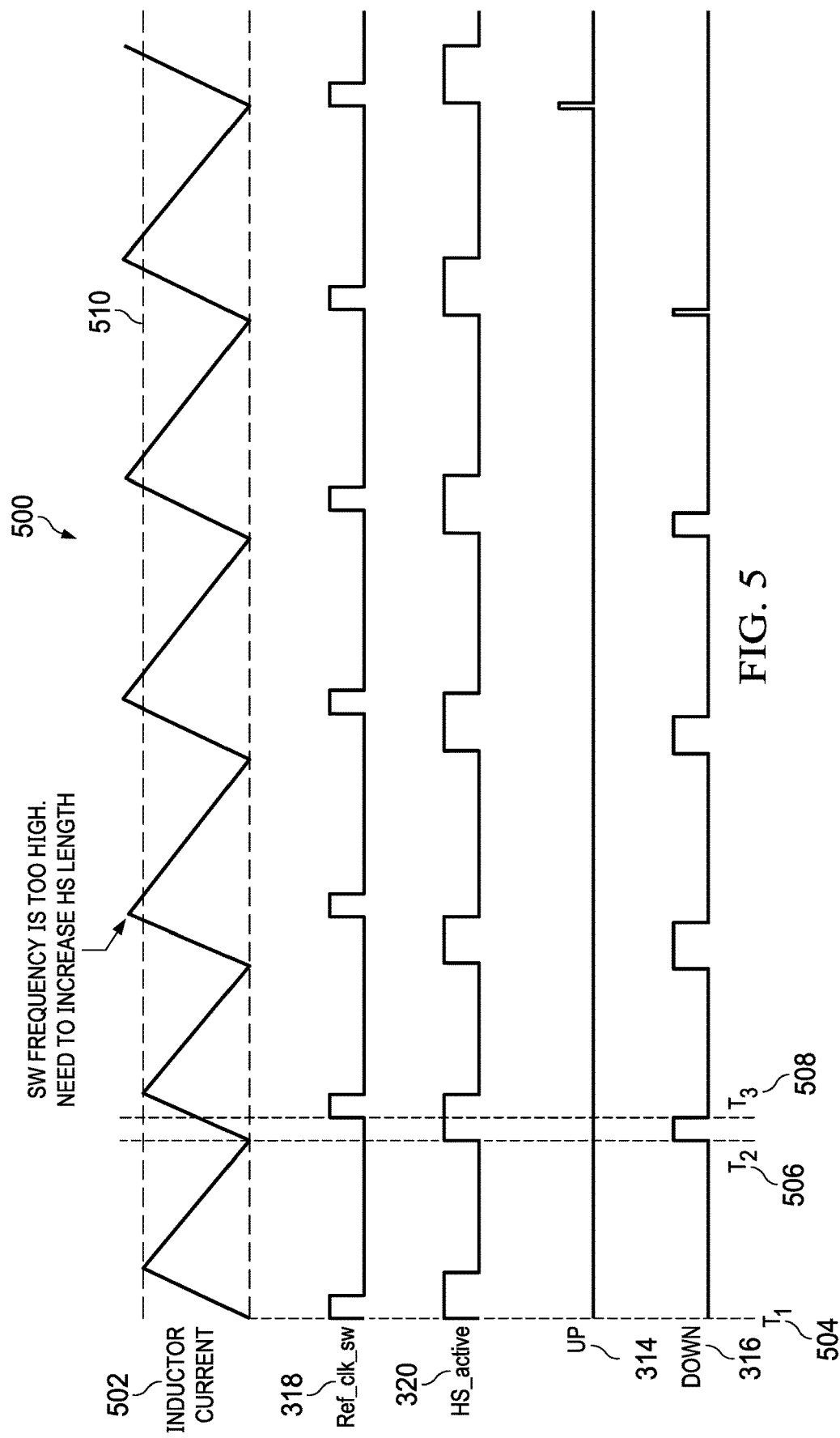
FIG. 5 is another example timing diagram corresponding to operation of the example digital ON-time generation system of FIG. 3.

FIG. 5 is another example timing diagram 500 corresponding to operation of the digital OTG system 300 of FIG. 3. The timing diagram 500 of FIG. 5 depicts an example waveform for an example inductor current 502 corresponding to current flowing through an inductor included in the converter 104 of FIG. 1. The timing diagram 500 of FIG. 5 includes the first signal (Up) 314, the second signal (Down) 316, the reference clock signal (Ref_clk_sw) 318, and the HS signal (HS_active) 320 of FIG. 3.

In the timing diagram 500 of FIG. 5, at a first example time (T1) 504, the PFD 302 of FIG. 3 does not detect a phase difference between the reference clock signal 318 and the HS signal 320. For example, the HS period of the converter 104 is synchronously triggered with the onset of the reference clock signal 318. At a second example time (T2) 506, the PFD 302 detects a phase difference based on the HS signal 320 going high prior to the reference clock signal 318. In response to the phase difference, the PFD 302 generates the second signal 316 with a pulse length corresponding to a time difference of the HS signal 320 going high and the reference clock signal 318 going high.

In the illustrated example of FIG. 5, the pulse length of the second signal 316 begins with the second time 506 and ends at a third example time 508. The PFD 302 outputs the up signal 314 when the switching frequency of the converter 104 of FIG. 1 is too low. The PFD 302 outputs the second signal 316 when the switching frequency of the converter 104 is too high causing the HS period of the converter 104 to be too short in duration. In response to the HS period being too short in duration, the digital OTG system 300 increases the HS length 326 of FIG. 3 to direct the first pulse generator 308 to increase a delay associated with resetting the latch 312 of FIG. 3. By increasing the delay, the latch 312 can output the HS signal 320 to the power stage 102 for a longer duration, which in turn increases the HS period and correspondingly lowers the switching frequency. In response to lowering the switching frequency, the digital OTG system 300 can decrease the phase difference between the reference clock signal 318 and the HS signal 320.

Figure 6:
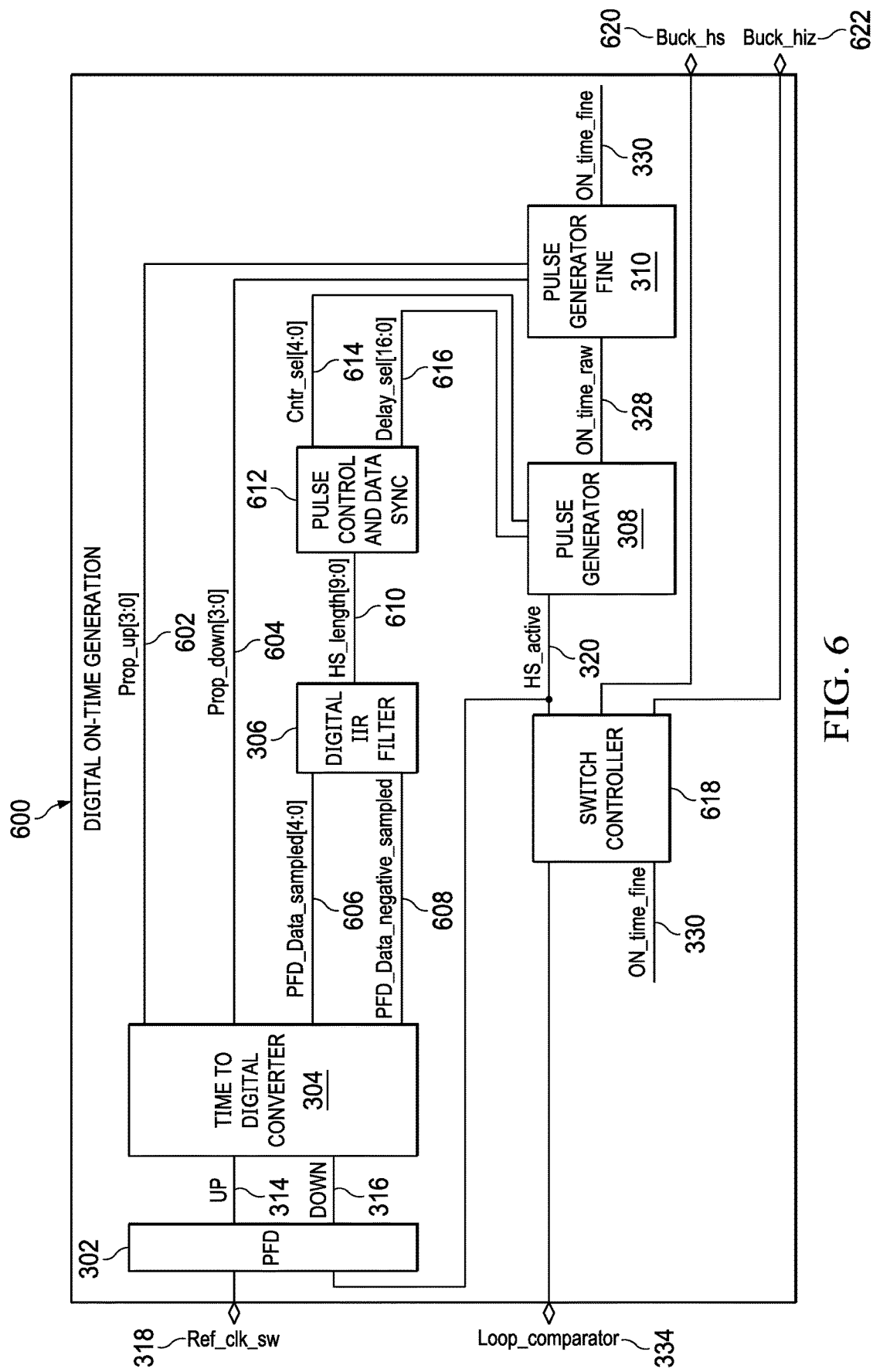
FIG. 6 is an example implementation of the example digital ON-time generation system of FIG. 3.

FIG. 6 is another example digital OTG system 600. The digital OTG system 600 of FIG. 6 includes the PFD 302, the TTD converter 304, the digital filter 306, the first pulse generator 308, and the second pulse generator 310 of the digital OTG system 300 of FIG. 3. In the digital OTG system 600 of FIG. 6, the PFD 302 is coupled to the TTD converter 304, which in turn is coupled to the digital filter 306 and the second pulse generator 310.

In the illustrated example of FIG. 6, the TTD converter 304 generates an example prop up digital word (Prop up[3:0]) 602 and an example prop down digital word (Prop down[3:0]) 604 based on the up signal 314 and/or the down signal 316 generated by the PFD 302. In FIG. 6, the prop up digital word 602 corresponds to the first delay adjustment word and the prop down digital word 604 corresponds to the second delay adjustment word as described above in connection with FIG. 3. The prop up digital word 602 and/or the prop down digital word 604 are transmitted to the second pulse generator 310 to generate a time delay to adjust a switching phase and frequency of the converter 104 of FIG. 1. The prop up digital word 602 is a four-bit word that corresponds to a command to increase or prop up the switching phase and frequency of the converter 104. The prop down digital word 604 is a four-bit word that corresponds to a command to decrease or prop down the switching frequency of the converter 104. Alternatively, the prop up digital word 602 and/or the prop down digital word 604 may have more than or fewer than four bits. In some examples, the first digital word 322 of FIG. 3 can include the prop up digital word 602 and the prop down digital word 604.

In the illustrated example of FIG. 6, the TTD converter 304 generates a first example PFD digital word (PFD_Data_sampled[4:0]) 606 and a second example PFD digital word (PFD_Data_negative_sampled) 608 based on the up signal 314 and/or the down signal 316 generated by the PFD 302. The first PFD digital word 606 and the second PFD digital word 608 are transmitted to the digital filter 306 to generate an example HS length 610 to correspond to the HS period of the converter 104. The first PFD digital word 606 is a five-bit word that corresponds to the phase error determined by the PFD 302. The second PFD digital word 608 is a one-bit word that corresponds to whether the first PFD digital word 606 is positive or negative. Alternatively, the first PFD digital word 606 may have fewer than or more than five bits and/or the second PFD digital word 608 may have more than one bit. In some examples, the second digital word 324 of FIG. 3 can include the first PFD digital word 606 and the second PFD digital word 608.

In FIG. 6, the digital filter 306 generates the HS length 610 based on at least one of the first PFD digital word 606 or the second PFD digital word 608. The HS length 610 of FIG. 6 is a 10-bit word. Alternatively, the HS length 610 of FIG. 6 may have fewer than or more than 10. In some examples, the HS length 326 of FIG. 3 corresponds to the HS length 610 of FIG. 6.

In the illustrated example of FIG. 6, the digital filter 306 transmits the HS length 610 to an example pulse control and data synchronizer (Pulse Control & Data Sync) 612. The pulse control and data synchronizer 612 generates an example coarse delay selection word (Cntr_sel[4:0]) 614 and an example accurate delay selection word (Delay_sel [16:0]) 616 by decoding the HS length 610 from the digital filter 306. The pulse control and data synchronizer 612 is coupled to the digital filter 306 and the first pulse generator 308. The pulse control and data synchronizer 612 transmits the coarse delay selection word 614 and the accurate delay selection word 616 to the first pulse generator 308.

In the illustrated example of FIG. 6, the coarse delay selection word 614 is a 5-bit word that selects a quantity of rounds of a ring oscillator included in the first pulse generator 308 to operate. Alternatively, the coarse delay selection word 614 may have fewer or more than 5 bits. The accurate delay selection word 616 is a 17-bit word that determines where a pulse is taken from the ring oscillator included in the first pulse generator 308 and determines whether a rising edge or a falling edge is taken from the ring oscillator.

In the illustrated example of FIG. 6, the first pulse generator 308 is coupled to an example switch controller 618 to operate the power stage 102 of FIG. 1. In some examples, the switch controller 618 includes the latch 312 of FIG. 3. The switch controller 618 generates at least one of the HS signal 320, a first example buck converter signal (Buck_hs) 620, or a second example buck converter signal (Buck_hiz) 622 in response to obtaining at least one of the second time signal 330 of FIG. 3 or the loop comparator signal 334 of FIG. 3. In FIG. 6, the first buck converter signal 620 controls an operation of the high-side switch 106 and/or the low-side switch 107 when the second buck converter signal 622 is low. For example, the first buck converter signal 620 turns ON the high-side switch 106 of FIG. 1 when the first buck converter signal 620 is high and the second buck converter signal 622 is low. In other examples, the first buck converter signal 620 turns ON the low-side switch 107 of FIG. 1 when the first buck converter signal 620 is low and the second buck converter signal 622 is low. In yet other examples, the high-side switch 106 and the low-side switch 107 are turned off when the second buck converter signal 622 is high.

While an example manner of implementing the digital OTG system 600 is illustrated in FIG. 6, one or more of the elements, processes, and/or devices illustrated in FIG. 6 may be combined, divided, re-arranged, omitted, eliminated, and/or implemented in any other way. Further, the example PFD 302, the example TTD converter 304, the example digital filter 306, the first example pulse generator 308, the second example pulse generator 310, the example pulse control and data synchronizer 610, the example switch controller 618, and/or, more generally, the example digital OTG system 600 of FIG. 6 may be implemented by hardware, software, firmware, and/or any combination of hardware, software, and/or firmware. Thus, for example, any of the example PFD 302, the example TTD converter 304, the example digital filter 306, the first example pulse generator 308, the second example pulse generator 310, the example pulse control and data synchronizer 610, the example switch controller 618, and/or, more generally, the example digital OTG system 600 could be implemented by one or more analog or digital circuit(s), logic circuits, programmable processor(s), programmable controller(s), graphics processing unit(s) (GPU(s)), digital signal processor(s) (DSP(s)), application specific integrated circuit(s) (ASIC(s)), programmable logic device(s) (PLD(s)), and/or field programmable logic device(s) (FPLD(s)). When reading any of the apparatus or system claims of this patent to cover a purely software and/or firmware implementation, at least one of the example PFD 302, the example TTD converter 304, the example digital filter 306, the first example pulse generator 308, the second example pulse generator 310, the example pulse control and data synchronizer 610, and/or the example switch controller 618 is/are hereby expressly defined to include a non-transitory computer readable storage device or storage disk such as a memory, a digital versatile disk (DVD), a compact disk (CD), a Blu-ray disk, etc., including the software and/or firmware. Further still, the example digital OTG system 600 of FIG. 6 may include one or more elements, processes, and/or devices in addition to, or instead of, those illustrated in FIG. 6, and/or may include more than one of any or all of the illustrated elements, processes, and devices.

Figure 7:
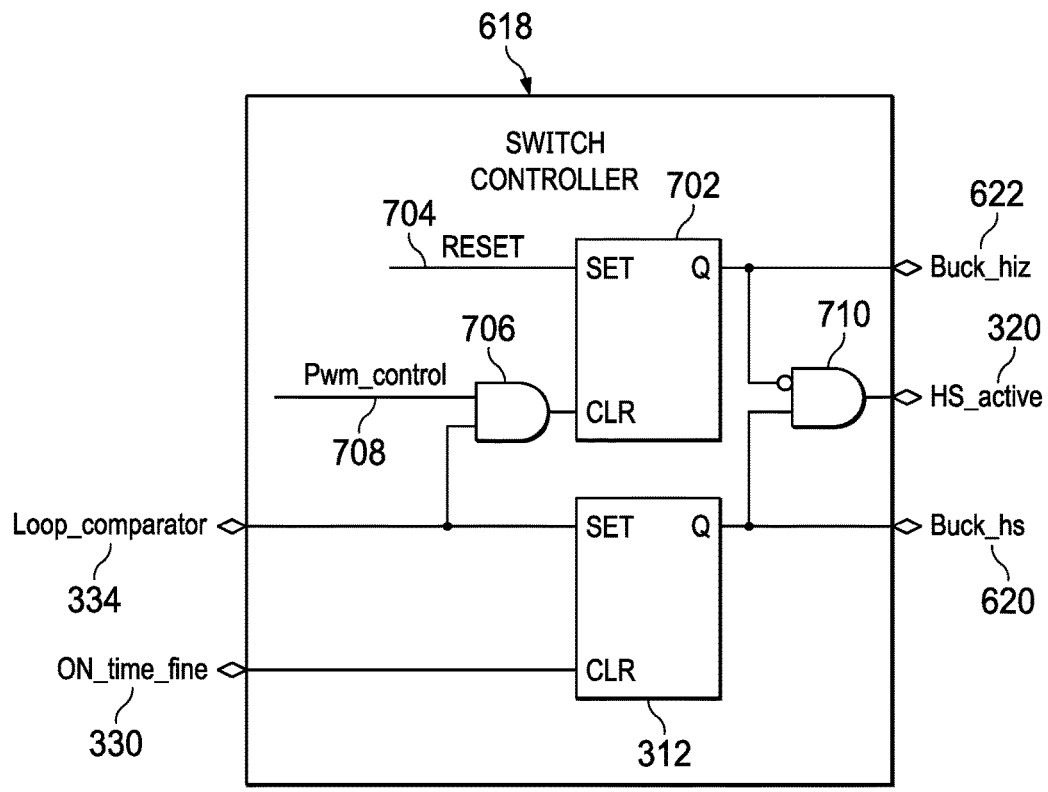
FIG. 7 is an example implementation of an example switch controller of the example digital ON-time generation system of FIG. 6.

FIG. 7 is an example implementation of the example switch controller 618 of FIG. 6. The switch controller 618 includes the latch 312 of FIG. 3 to output the first buck converter signal 620 when the loop comparator signal 334 sets the latch 312. The latch 312 does not output a signal and/or otherwise clears the output of the latch 312 when the second time signal 330 of FIG. 3 clears the latch 312.

In the illustrated example of FIG. 7, the switch controller 618 includes the latch 312 of FIG. 3, which is a first latch, and includes a second example latch 702. The second latch 702 is a level sensitive SR latch. Alternatively, the switch controller 618 may be implemented with a different type of flip-flop or latch for the second latch 702. The second latch 702 outputs the second buck converter signal 622 when an example reset signal 704 sets the second latch 702. For example, the reset signal 704 may be generated and/or otherwise controlled by main logic. In some examples, the reset signal 704 is asserted when the converter 104 is disabled and de-asserted when the converter 104 is enabled. In FIG. 7, the second latch 702 does not output a signal and/or otherwise clears the output of the second latch 702 when a first example logic gate 706 coupled to the clear pin, or the reset pin, of the second latch 702 outputs a high signal. The first logic gate 706 of FIG. 7 is an AND logic gate, which generates a high signal when the loop comparator signal 334 is high and an example pulse width modulation (PWM) control signal 708 is high. For example, the PWM control signal 708 may correspond to a signal generated internally to the converter 104.

The switch controller 618 of FIG. 7 includes a second example logic gate 710 coupled to the first latch 312 and the second latch 702. The second logic gate 710 is an AND logic gate. The second logic gate 710 outputs the HS signal 320 when the output of the first latch 312 is high and the output of the second latch 702 is low. In FIG. 7, the output of the second latch 702 is inverted at the input of the second logic gate 710.

In operation, the switch controller 618 turns ON the high-side switch 106 of FIG. 1 when the loop comparator signal 334 sets the first latch 312, which instructs the first latch 312 to transmit the first buck converter signal 620 to the control logic 109 of the power stage 102 of FIG. 1. The switch controller 618 generates the HS signal 320 in response to setting the first latch 312 and resetting the second latch 702. The second latch 702 is reset when the converter 104 is set to PWM mode. In response to setting the converter 104 to PWM mode, the output of the second latch 702 remains low and switching of the converter 104 is controlled with the first latch 312. The second latch 702 outputs a low signal when the first logic gate 706 clears the second latch 702. For example, the second buck converter signal 622 is low when the second latch 702 is cleared by the first logic gate 706.

In FIG. 7, when the second buck converter signal 622 is low, the switch controller 618 turns OFF the high-side switch 106 and turns ON the low-side switch 107 when the second time signal 330 clears the first latch 312 to generate a low signal for the first buck converter signal 620. In FIG. 7, when the second buck converter signal 622 is low, the switch controller 618 turns ON the high-side switch 106 and turns OFF the low-side switch 107 when the loop comparator signal 334 sets the first latch 312 to generate a high signal for the first buck converter signal 620.

Figure 8A:
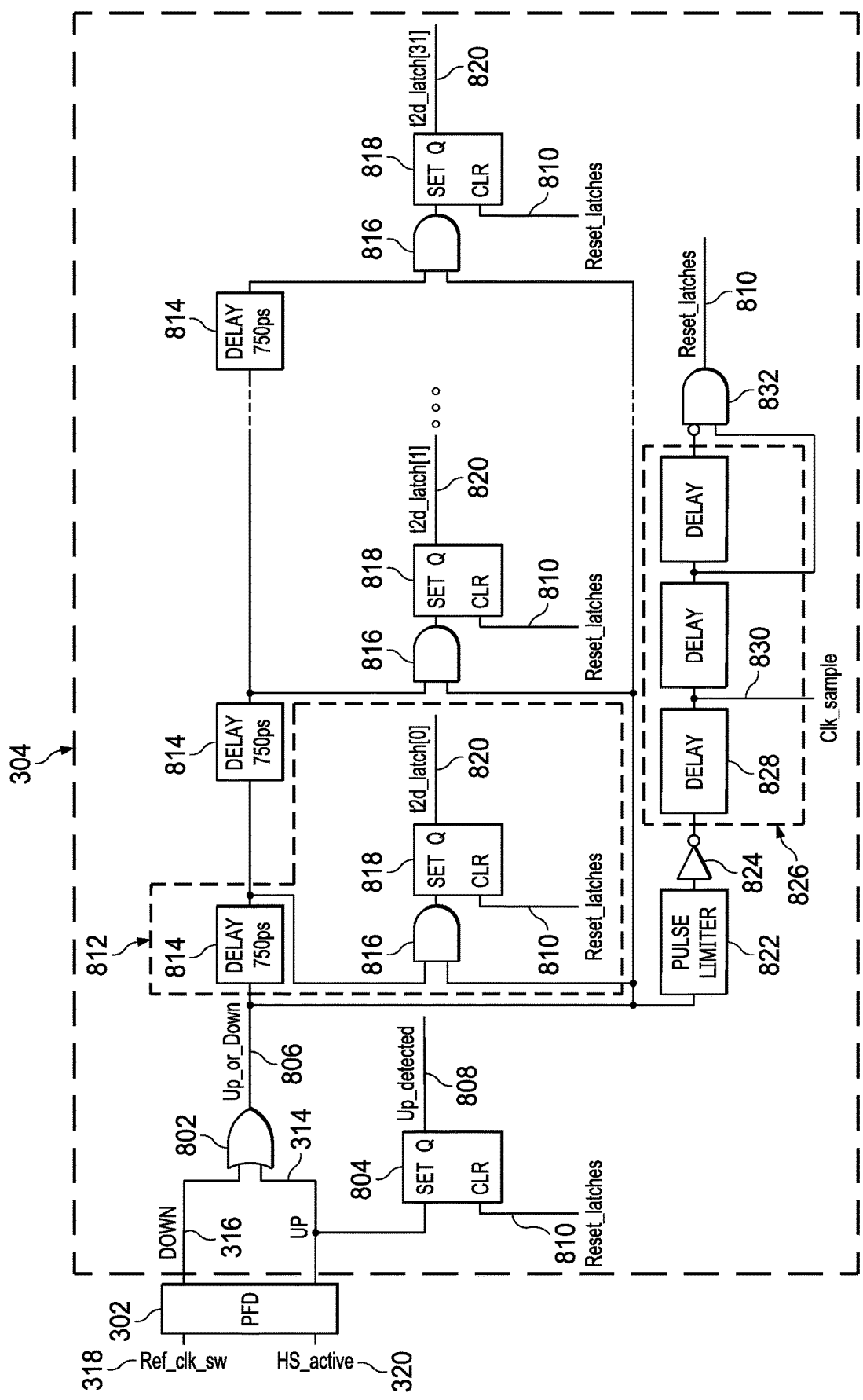
FIGS. 8A and 8B depict an example implementation of an example time-to-digital converter of the example digital ON-time generation system of FIGS. 3 and/or 6.

FIG. 8A depicts a first example portion of an example implementation of the TTD converter 304 of the example digital OTG system 300 of FIGS. 3 and/or 6. In FIG. 8A, the TTD converter 304 obtains the up signal 314 and the down signal 316 from the PFD 302 of FIGS. 3 and/or 6. The PFD 302 is coupled to a third example logic gate 802 and a third example latch 804. In FIG. 8A, the third logic gate is an OR logic gate that outputs an example Up_or_down signal 806 when at least one of the up signal 314 or the down signal 316 is high. The third latch 804 is a level sensitive SR latch. Alternatively, the third latch 804 may be any other type of flip-flop or latch. The third latch 804 outputs an example up detected signal (Up_detected) 808 when the up signal 314 is high and sets the third latch 804. The third latch 804 is reset when an example reset latches signal (Reset_latches) signal 810 clears the third latch 804 (e.g., the reset latches signal 810 is a high signal).

In the illustrated example of FIG. 8A, the TTD converter 304 includes thirty-two example delay circuit networks 812, where the delay circuit networks 812 are coupled to each other in series. In FIG. 8A, a first one of the thirty-two delay circuit networks 812 is coupled to the third logic gate 802. Each of the thirty-two delay circuit networks 812 include an example delay circuit 814, an example logic gate 816, and an example latch 818. The thirty-two delay circuits 814, and/or, more generally, the thirty-two delay circuit networks 812 can correspond to a delay line (e.g., a delay circuit line). Each of the delay circuits 814 correspond to 750 ps delays. Alternatively, one or more of the thirty-two delay circuits 814 may correspond to delays of different times than 750 ps. Each of the logic gates 816 included in the delay circuit networks 812 are AND gates. The logic gates 816 output a high signal when a signal from the corresponding delay circuit 814 is a high signal and when the up_or_down signal is high. Each of the latches 818 included in the delay circuit networks 812 are level sensitive SR latches. Alternatively, one or more of the thirty-two latches 818 may be a different type of flip-flop or latch.

In the illustrated example of FIG. 8A, the TTD converter 304 converts and/or otherwise translates a phase difference between the reference clock signal 318 and the HS signal 320 of FIG. 3 determined by the PFD 302 by generating an example time-to-digital (t2d) latch digital word 820. In FIG. 8A, the t2d latch digital word 820 is a 32-bit word. Alternatively, the t2d latch digital word 820 may be fewer or more than 32 bits. The TTD converter 304 sets a corresponding one of the bits of the t2d latch digital word 820 high when a time delay corresponding to one of the delay circuits 814 has passed and/or otherwise elapsed.

In operation, in response to the up_or_down signal 806 going high, a first one of the delay circuits 814 generates a high signal when a time of 750 ps has elapsed. The output of the first one of the delay circuits 814 instructs a first one of the logic gates 816 to set a first one of the latches 818 and, thus, set a first one of the bits of the t2d latch digital word 820 high. In response to a subsequent 750 ps time period elapsing, a second one of the delay circuits 814 coupled to the first one generates and transmits a high signal to a second one of the logic gates 816. The second one of the logic gates 816 sets a second one of the latches 818 and, thus, sets a second one of the bits of the t2d latch digital word 820 high. In such examples, the t2d latch digital word 820 can correspond to b0000_0000_0000_0000_0000_0000_0000_0011, where the two least significant bits (LSBs) correspond to the first and second ones of the bits set by the first and the second ones of the latches 818.

In the illustrated example of FIG. 8A, the TTD converter 304 includes an example pulse limiter (e.g., a pulse limiter circuit) 822 coupled to the third logic gate 802. The pulse limiter 822 is a circuit that ensures that the high times (e.g., time durations associated with a signal being high) and the lows times (e.g., time durations associated with a signal being low) of the up_or_down signal 806 are long enough (e.g., the pulse length of the up_or_down signal 806 is wide enough) to be used as a clock. For example, the pulse limiter 822 is asserted and maintained high until the up_or_down signal 806 stays high. If the up_or_down signal 806 goes low (even temporarily), an output signal of the pulse limiter 822 is maintained high for at least a minimum high time as defined by and/or otherwise determined by a configuration of the pulse limiter 822. In other examples, when the up_or_down signal 806 goes low, the output signal generated by the pulse limiter 822 is maintained low for at least a minimum low time as defined by and/or otherwise determined by the configuration of the pulse limiter 822. For example, the output signal of the pulse limiter 822 is maintained low even if the up_or_down signal 806 rises again (e.g., goes from low to high) before the minimum low time has elapsed.

The pulse limiter 822 is coupled to an example inverter 824 to invert an output of the pulse limiter 822. The inverter 824 is coupled to an example delay line 826 that includes three example delay circuits 828 coupled together in series. An example clock sample signal 830 is obtained and/or otherwise sampled at an output of a first one of the delay circuits 828 included in the delay line 826. Alternatively, the delay line 826 may include fewer or more than three delay circuits 828. The delay line 826 of FIG. 8A is coupled to a fourth example logic gate 832. The fourth logic gate 832 is an AND gate. The fourth logic gate 832 generates the reset latches signal 810 when a second one of the delay circuits 828 outputs a high signal and a third one of the delay circuits 828 outputs a low signal. The third one of the delay circuits 828 is operative to ensure that enough time is provided to the TTD converter 304 to reset the latches 818 of FIG. 8A. For example, the reset latches signal 810 is generated by the delay line 826 and the fourth logic gate 832 after the measurement is sampled with the clock sample signal 830.

Figure 8B:
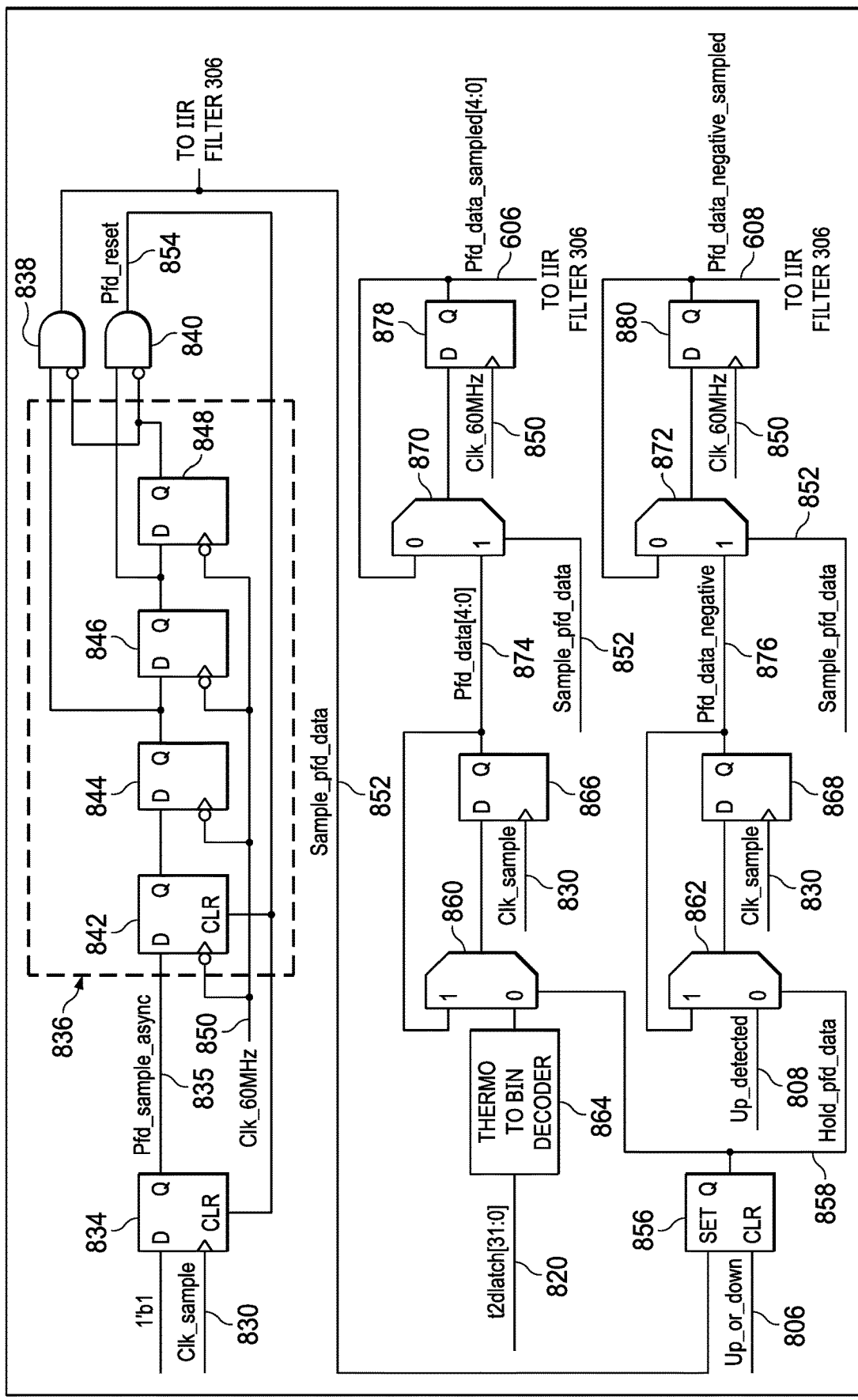

FIG. 8B depicts a second example portion of the implementation of the TTD converter 304 depicted in FIG. 8A. In the illustrated example of FIG. 8B, the TTD converter 304 includes a fourth example flip-flop 834 coupled to the first one of the delay circuits 828 of FIG. 8A. The fourth flip-flop 834 is a D flip-flop. Alternatively, the fourth flip-flop 834 may be a different type of flip-flop or latch. The fourth flip-flop 834 has a high signal (e.g., a bit value of 1 represented by 1'b1) coupled to the data (D) input of the fourth flip-flop 834 and the clock sample signal 830 of FIG. 8A coupled to the clock input of the fourth flip-flop 834. For example, the fourth flip-flop 834 latches a value of the data input to the output (Q) of the fourth flip-flop 834 when the clock sample signal 830 goes high. In FIG. 8B, the fourth flip-flop 834 generates an example PFD asynchronous signal 835 to trigger an example PFD sample flip-flop network 836.

In the illustrated example of FIG. 8B, the PFD sample flip-flop network 836 is coupled to the fourth flip-flop 834, a fifth example logic gate 838, and a sixth example logic gate 840. The PFD sample flip-flop network 836 includes four example PFD flip-flops 842, 844, 846, 848 including a first example PFD flip-flop 842, a second example PFD flip-flop 844, a third example PFD flip-flop 846, and a fourth example PFD flip-flop 848. The first through fourth PFD flip-flops 842, 844, 846, 848 are D flip-flops. Alternatively, one or more of the first through the fourth PFD flip-flops 842, 844, 846, 848 may be a different type of flip-flop or latch. The first PFD flip-flop 842 and the third PFD flip-flop 846 have an inverter coupled to the clock inputs of the first PFD flip-flop 842 and the third PFD flip-flop 846. The TTD converter 304 includes the PFD sample flip-flop network 836 to act and/or otherwise perform as a synchronizing enable from the clock sample signal 830 domain to a reference clock domain corresponding to an example main clock signal (Clk_60 MHz) 850. The main clock signal 850 in FIG. 8B is depicted as having a frequency of 60 MHz. Alternatively, the main clock signal 850 may have a different frequency.

In the illustrated example of FIG. 8B, the PFD sample flip-flop network 836 can direct at least one of the fifth logic gate 838 to output an example sample PFD data signal 852 or the sixth logic gate 840 to output an example PFD reset signal 854. The sample PFD data signal 852 sets a fifth example latch 856 to initialize and/or otherwise trigger a sampling of the t2d digital word 820. The PFD reset signal 854 clears and/or otherwise resets the fourth flip-flop 834 and the first PFD flip-flop 842 when the PFD reset signal 854 is pulled high.

The fifth latch 856 of FIG. 8B is an SR latch. Alternatively, the fifth latch 856 may be any other type of flip-flop or latch. The fifth latch 856 outputs an example hold PFD data signal 858 when the sample PFD data signal 852 sets the fifth latch 856. For example, the fifth latch 856 can latch the sample PFD data signal 852 to the output of the fifth latch 856 to generate the hold PFD data signal 858. The hold PFD data signal 858 is operative to ensure that at least one of a third example PFD digital word (PFD_data[4:0]) 874 or an output from an example decoder 864 is stable during the sampling process of the TTD converter 304.

In the illustrated example of FIG. 8B, the hold PFD data signal 858 instructs a first example multiplexer 860 and a second example multiplexer 862 to select an input. The first multiplexer 860 selects either an input from the decoder 864 or the third PFD digital word 874. For example, the first multiplexer 860 can select the input from the decoder 864 when the hold PFD data signal 858 is a first voltage and can select the third PFD digital word 874 when the hold PFD data signal 858 is a second voltage, where the first voltage is different from the second voltage. The second multiplexer 862 of FIG. 8B selects either the up detected signal 808 of FIG. 8A or a fourth example PFD digital word 876. For example, the second multiplexer 862 can select the up detected signal 808 when the hold PFD data signal 858 is the first voltage and can select the fourth PFD digital word 876 when the hold PFD data signal 858 is the second voltage.

The decoder 864 of FIG. 8B is a thermometric decoder that converts thermometric code, or sometimes referred to as unary coding, to binary code. For example, the decoder 864 can convert the t2d digital word 820 in thermometric code into binary code. The first multiplexer 860 can select a portion of the thermometric code from the decoder 864 to be stored in the third PFD digital word 874 via a sixth example flip-flop 866. The sixth flip-flop 866 can latch the output from the first multiplexer 860 to an output of the sixth flip-flop 866 to build and/or otherwise assemble the third PFD digital word 874 when the clock sample signal 830 is pulled high. The third PFD digital word 874 of FIG. 8B is five-bit digital word. Alternatively, the third PFD digital word 874 may have a different quantity of bits. The second multiplexer 862 can select a value to be stored in the second PFD digital word 608 via a seventh example flip-flop 868. The seventh flip-flop 868 can latch the output from the second multiplexer 862 to an output of the seventh flip-flop 868 to build and/or otherwise assemble the fourth PFD digital word 876 when the clock sample signal 830 is pulled high. The fourth PFD digital word 874 of FIG. 8B is one-bit digital word. Alternatively, the fourth PFD digital word 874 may have more than one bit. The sixth flip-flop 866 and the seventh flip-flop 868 are D flip-flops. Alternatively, one or both the sixth flip-flop 866 and the seventh flip-flop 868 may be any other type of flip-flop or latch.

In the illustrated example of FIG. 8B, the sample PFD data signal 852 instructs a third example multiplexer 870 and a fourth example multiplexer 872 to select an input. The third multiplexer 870 selects an input to an example eighth flip-flop 878 either from the first PFD digital word 606 or the fourth PFD digital word 874. In FIG. 8B, the first PFD digital word 606 is a sampling of the third PFD digital word 874 at a point in time. In FIG. 8B, the second PFD digital word 608 is a sampling of the fourth PFD digital word 876 at a point in time. In FIG. 8B, the third multiplexer 870 can select the first PFD digital word 606 as the input when the sample PFD data signal 852 is a third voltage and can select the third PFD digital word 874 when the sample PFD data signal 852 is a fourth voltage, where the third voltage is different from the fourth voltage.

In the example of FIG. 8B, the fourth multiplexer 872 selects an input to an example ninth flip-flop 880 either from the second PFD digital word 608 or the fourth PFD digital word 876. In FIG. 8B, the fourth multiplexer 872 can select the second PFD digital word 608 as the input when the sample PFD data signal 852 is the third voltage and can select the fourth PFD digital word 876 when the sample PFD data signal 852 is the fourth voltage. In FIG. 8B, the TTD converter 304 transmits at least one of the first PFD digital word 606 or the second PFD digital word 608 to the digital filter 306 of FIGS. 3 and/or 6.

Figure 9:
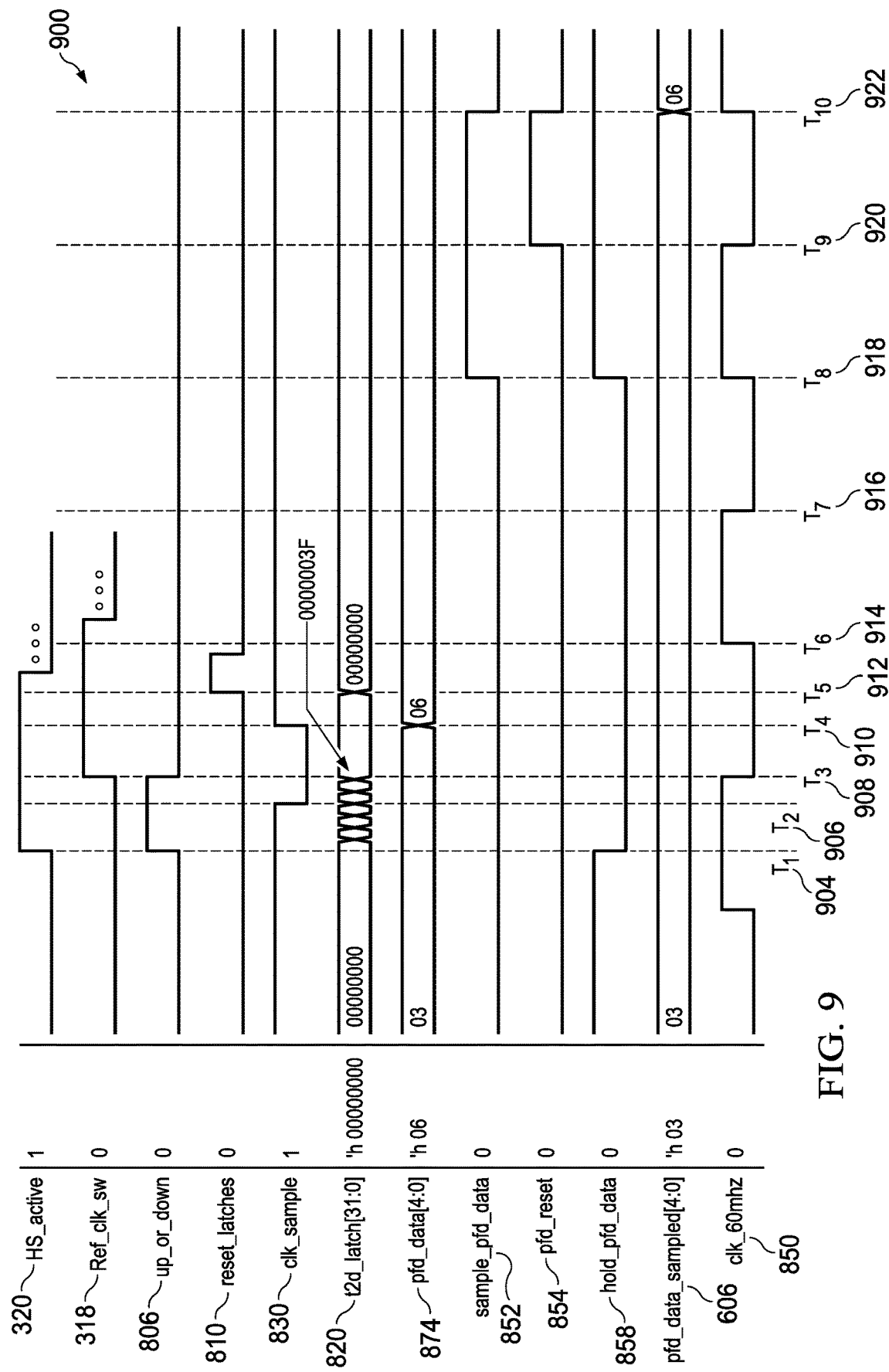
FIG. 9 is an example timing diagram corresponding to operation of the example time-to-digital converter of FIGS. 8A and 8B.

FIG. 9 is an example timing diagram 900 corresponding to operation of the TTD converter 304 depicted in FIGS. 8A and 8B. The timing diagram 900 of FIG. 9 depicts waveforms of the HS signal 320, the reference clock signal 318, the up_or_down signal 806, the reset latches signal 810, the clock sample signal 830, the t2d digital word 820, the first PFD digital word 606, the sample PFD data signal 852, the PFD reset signal 854, the hold PFD data signal 858, the main clock signal 850, and the third PFD digital word 874 of FIGS. 8A and/or 8B.

In the illustrated example of FIG. 9, at a first example time (T1) 904, the HS signal 320 is high and the reference clock signal 318 is low. In response to the PFD 302 of FIG. 3 determining a phase difference between the HS signal 320 and the reference clock signal 318, the PFD 302 can generate the down signal 316. The third logic gate 802 of FIG. 8A outputs a high signal for the up_or_down signal 806 at substantially the first time 904. The clock sample signal 830 is high at the first time 904 until a second example time (T2) 906, during which the clock sample signal 830 is pulled low.

In the timing diagram 900 of FIG. 9, at a third example time (T3) 908, the reference clock signal 318 is pulled high. In response to the reference clock signal 318 going high, the PFD 302 does not output the up signal 314 or the down signal 316, which in turn directs the third logic gate 802 to output a low signal for the up_or_down signal 806 at substantially shortly after the third time 908 (e.g., 1 ns, 2 ns, etc.).

At a fourth example time (T4) 910, the clock sample signal 830 is pulled high in response to the pulse limiter 822 of FIG. 8A processing the up_or_down_signal 806 starting from the first time 904. For example, the clock sample signal 830 is pulled high after the first one of the delay circuits 828 of the delay line 826 of FIG. 8A outputs a high signal. In response to the clock sample signal 830 being pulled high, the fourth flip-flop 834 of FIG. 8B latches a high value corresponding to the data input of 1 b1 to an output of the fourth flip-flop 834 to generate the PFD sample asynchronous signal 835. In response to the clock sample signal 830 being pulled high, decoded data included in the t2d latch digital word 820 is clocked to the sixth flip-flop 866 and the up detected signal 808 is clocked to the seventh flip-flop 868.

In the timing diagram 900 of FIG. 9, at a fifth example time (T5) 912, the reset latches signal 810 is pulled high and clears the latches 818 included in the delay circuit networks 812 of FIG. 8A. For example, the t2d digital word 820 is represented in FIG. 9 by a bit string of zeros after the latches 818 are cleared. At a sixth example time (T6) 914, the main clock signal 850 is pulled high. At a seventh example time (T7) 916, the main clock signal 850 is pulled low, which in turn triggers the first PFD flip-flop 842 to latch a high signal corresponding to the PFD sample asynchronous signal 835 to an output of the first PFD flip-flop 842. For example, the PFD sample asynchronous signal 835 is pulled high when the clock sample signal 830 is pulled high. The PFD sample asynchronous signal 835 is then synchronized to the reference clock domain with the PFD flip-flop network 836.

At an eighth example time (T8) 918, the main clock signal 850 is pulled high, which in turn directs the second PFD flip-flop 844 to latch the high signal from the data input of the second PFD flip-flop 844 to an output of the second PFD flip-flop 844. At the eighth time 918, the high signal from the output of the second PFD flip-flop 844 triggers the fifth logic gate 838 to output a high signal corresponding to the sample PFD data signal 852. For example, the sample PFD data signal 852 is pulled high after one falling-edge and one rising-edge of the main clock signal 850 has occurred. At the eighth time 918, the high signal corresponding to the sample PFD data signal 852 instructs the fifth latch 856 to latch the high signal to the output of the fifth latch 856 to generate the high signal corresponding to the hold PFD data signal 858. In other words, the hold PFD data signal 858 is asserted at the eighth time 918.

In the timing diagram 900 of FIG. 9, at an example ninth time (T9) 920, the main clock signal 850 is pulled low which, in turn, instructs the third PFD flip-flop 846 to latch the high signal from the output of the second PFD flip-flop 844 to the output of the third PFD flip-flop 846. At the ninth time 920, the third PFD flip-flop 846 outputs the high signal to the sixth logic gate 840, which in turn outputs a high signal corresponding to the PFD reset signal 854. In other words, the PFD reset signal 854 clears the fourth flip-flop 834 to reset the PFD sample asynchronous signal 835 and the first PFD flip-flop 842.

At a tenth example time (T10) 922, the main clock signal 850 is pulled high which, in turn, instructs the fourth PFD flip-flop 848 to latch a high signal from the output of the third PFD flip-flop 846 to the output of the fourth PFD flip-flop 848. At the tenth time 922, the fourth PFD flip-flop 848 directs the fifth logic gate 838 to output a low signal corresponding to the sample PFD data signal 852 and direct the sixth logic gate 840 to output a low signal corresponding to the PFD reset signal 854.

In the illustrated example of FIG. 9, the TTD converter 304 of FIGS. 8A and 8B samples the data included in the t2d digital word 820 and generates the third PFD digital word 874 and the fourth PFD digital word 876 from the eighth time 918 until the tenth time 922. The TTD converter 304 resets the PFD sample flip-flop network 836 via the PFD reset signal 854 from the ninth time 920 until the tenth time 922. At the tenth time 922, the TTD converter 304 generates the first PFD digital word 606. At the tenth time 922, the TTD converter 304 transmits at least the first PFD digital word 606 to the digital filter 306.

Figure 10:
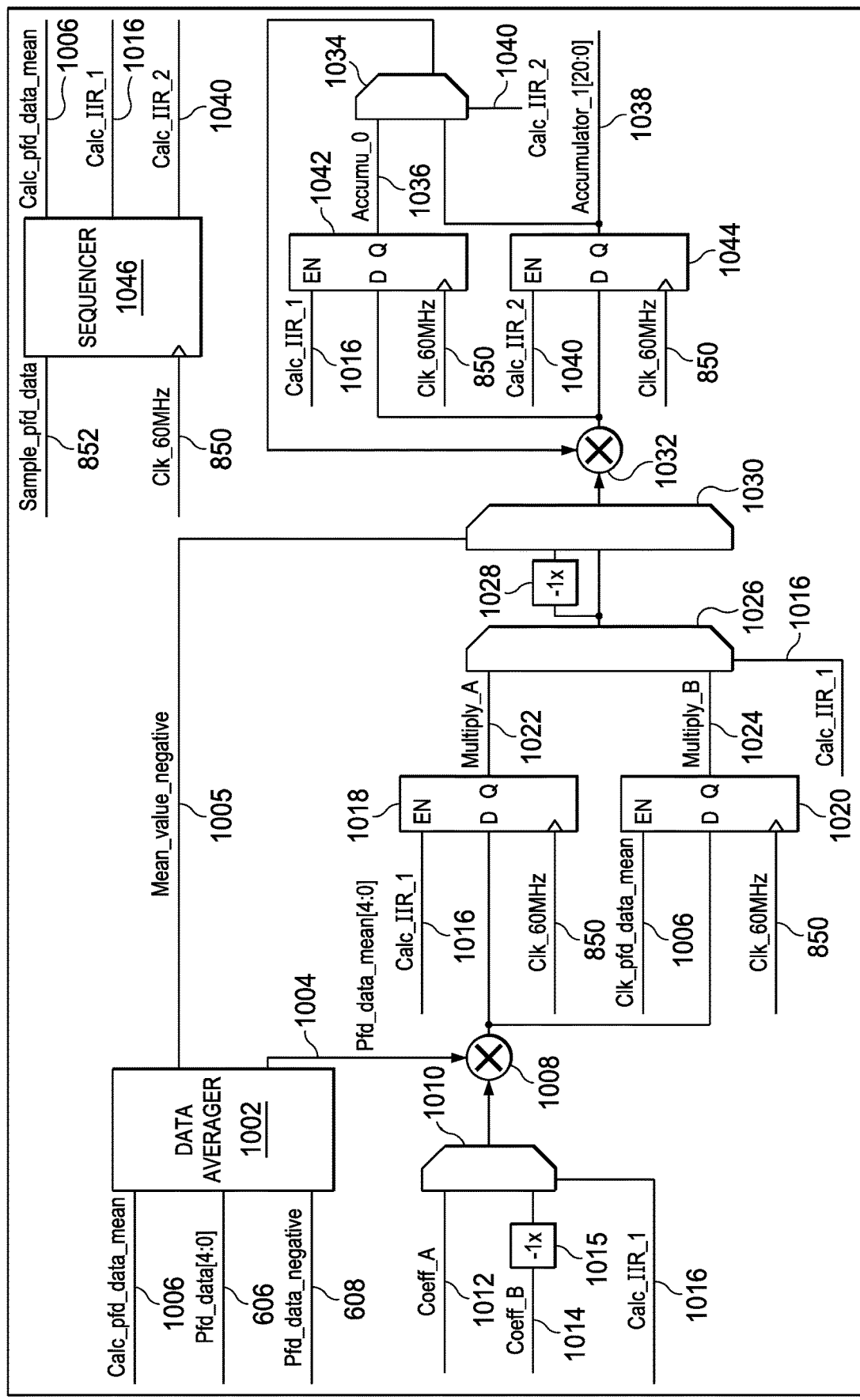
FIG. 10 is an example implementation of an example infinite impulse response filter of the example digital ON-time generation system of FIGS. 3 and/or 6.

FIG. 10 is an example implementation of the digital filter 306 of FIGS. 3 and/or 6 of the example digital OTG system 300 of FIGS. 3 and/or 6. The digital filter 306 of FIG. 10 includes an example data averager 1002 that calculates at least one of an example PFD data average (Pfd_data_mean [4:0]) 1004 or an example PFD data negative value (Mean_value_negative) 1005 based on at least one of the first PFD digital word 606, the second PFD digital word 608, or an example data average signal (Calc_pfd_data_mean) 1006. The PFD data average 1004 corresponds to a calculated average of the last four instances of the PFD digital word 606. Alternatively, the PFD data average 1004 may correspond to a calculated average of fewer or more than four instances of the PFD digital word 606. The PFD data negative value 1005 corresponds to a sign associated with the PFD data average 1004 (e.g., a negative sign, a positive sign, etc.). Alternatively, the digital filter 306 may be implemented without the data averager 1002.

The data average signal 1006 of FIG. 10 is a command or an instruction that directs the data averager 1002 to determine the PFD data average 1004 and the PFD data negative value 1005. In response to calculating the PFD data average 1004, the data averager 1002 transmits the PFD data average 1004 to an example multiplier 1008. The multiplier 1008 of FIG. 10 is a 10-bit FP multiplier. Alternatively, the multiplier 1008 may multiply fewer or more than 10 bits and/or calculate a multiplication in any other type of format. The multiplier 1008 calculates a multiplication of the PFD data average 1004 and an output from a first example multiplexer 1010. The first multiplexer 1010 selects and/or otherwise multiplexes from a first example coefficient (Coeff_A) 1012 or a second example coefficient (Coeff_B) 1014 scaled by a first example scalar multiplier 1015, where the selection or multiplexing is based on a value of a first example multiplexer selector signal (Calc_IIR_1) 1016. The first coefficient 1012 and the second coefficient 1014 are 10-bit fixed point (FP) coefficients. Alternatively, the first coefficient 1012 and/or the second coefficient 1014 may have a different number of bits and/or have a different format other than FP. The first scalar multiplier 1015 calculates a multiplication of the second coefficient 1014 and a value of −1. Alternatively, the first scalar multiplier 1015 may scale and/or otherwise multiply the second coefficient 1014 with a different value than −1.

In the illustrated example of FIG. 10, the multiplier 1008 generates and transmits an output to a first example IIR flip-flop 1018 and a second example IIR flip-flop 1020. The first IIR flip-flop 1018 and the second IIR flip-flop 1020 are D flip-flops. Alternatively, the first IIR flip-flop 1018 and/or the second IIR flip-flop 1020 may be a different type of flip-flop or latch. The first IIR flip-flop 1018 latches the output from the multiplier 1008 to an output of the first IIR flip-flop 1018 when the first multiplexer selector signal 1016 is high and/or otherwise enables the first IIR flip-flop 1018 and the main clock signal 850 is high. The first IIR flip-flop 1018 generates a first example multiply signal (Multiply_A) 1022 when the first IIR flip-flop 1018 latches the input to the output. The second IIR flip-flop 1020 latches the output from the multiplier 1008 to an output of the second IIR flip-flop 1020 when the data average signal 1006 is high and/or otherwise enables the second IIR flip-flop 1020 and the main clock signal 850 is high. The second IIR flip-flop 1020 generates a second example multiply signal (Multiply_B) 1024 when the second IIR flip-flop 1020 latches the input to the output.

In the illustrated example of FIG. 10, a second example multiplexer 1026 selects either the first multiply signal 1022 or the second multiply signal 1024 based on a value of the first multiplexer selector signal 1016. In response to the selecting, the second multiplexer 1026 generates an output to a second example scalar multiplier 1028 and a third example multiplexer 1030. The second scalar multiplier 1028 of FIG. 10 calculates a multiplication of the output of the second multiplexer 1026 and a value of −1. Alternatively, the second scalar multiplier 1028 may scale and/or otherwise multiply the output of the second multiplexer with a different value than −1.

The third example multiplexer 1030 of FIG. 10 selects either the output from the second multiplexer 1026 or the second scalar multiplier 1028 based on a value of the PFD data negative value 1005. In response to the selecting, the third multiplexer 1030 transmits a signal associated with the selection to an example adder 1032. The adder 1032 of FIG. 10 is a 21-bit accumulator. Alternatively, the adder 1032 may be a different size accumulator. The adder 1032 performs an addition operation on the output from the third multiplexer 1030 and an output from a fourth example multiplexer 1034. The fourth multiplexer 1034 selects either a first example accumulation value (Accumu_0) 1036 or a second example accumulation value (Accumulator_1[21:0]) 1038 based on a value of a second example multiplexer selector signal 1040.

The second accumulation value 1038 of FIG. 10 is a 21-bit digital word. Alternatively, the second accumulation value 1038 may have a different number of bits. The second accumulation value 1038 corresponds to the HS length 326 of FIG. 3. The second accumulation value 1038 is the output of the digital filter 306 shifted with 10 bits (coefficients are shifted), where the LSB of the second accumulation value equals approximately 125 ps that can be defined by the accuracy of the first pulse generator 308 of FIGS. 3 and/or 6.

In the illustrated example of FIG. 10, a third example IIR flip-flop 1042 latches the output from the adder 1032 to an output of the third IIR flip-flop 1042 when the main clock signal 850 is high and the first multiplexer selector signal 1016 is high and/or otherwise enables the third IIR flip-flop 1042. A fourth example IIR flip-flop 1044 latches the output from the adder 1032 to an output of the fourth IIR flip-flop 1044 when the main clock signal 850 is high and the second multiplexer selector signal 1040 is high and/or otherwise enables the fourth flip-flop 1044.

The digital filter 306 depicted in FIG. 10 executes and/or otherwise implements a calculation as described below in Equation (1):

$$IIR\_out = IIR\_out\_z^{-1} + Coef\ f\_A * data\_in - Coef\ f\_B * data\_in\_z^{-1} \quad \text{Equation (1)}$$

In the example of Equation (1) above, IIR_out corresponds to the second accumulator value 1038 and IIR_out_$z^{-1}$ corresponds to a previous value of the second accumulator value 1038. In the example of Equation (1) above, Coef f_A corresponds to the first coefficient 1012 and Coef f_B corresponds to the second coefficient 1014. In the example of Equation (1) above, data_in corresponds to the PFD data average 1004 and data_in_$z^{-1}$ corresponds to a previous value of the PFD data average 1004.

In operation, the digital filter 306 adapts a length of the HS length 326 of FIG. 3 (e.g., the Accumulator_1 1038) based on the PFD digital word 606. The digital filter 306 adapts the length by executing and/or otherwise implementing the example of Equation (1) above via an example sequencer 1046. The sequencer 1046 determines a sequence of operations or functions to be performed by the digital filter 306. In some examples, the sequencer 1046 directs the digital filter 306 to perform the calculation as described in the example of Equation (1) above in three 60 MHz clock cycles. Alternatively, the sequencer 1046 may direct the digital filter 306 to perform the calculation in fewer or more than three clock cycles and/or with a different frequency of the clock.

The sequencer 1046 of FIG. 10 generates at least one of the data average signal 1006, the first multiplexer selector signal 1016, or the second multiplexer selector signal 1040 based on at least one of the main clock signal 850 or the sample PFD data signal 852. For example, the main clock signal 850 and the sample PFD data signal 852 are pulled high at the eighth time 918 of the timing diagram 900 of FIG. 9. In such examples, the sequencer 1046 can generate a high signal for the first multiplexer selector signal 1016 to instruct the first multiplexer 1010 to select the first coefficient 1012, instruct the second multiplexer 1026 to select the first multiply signal 1022, enable the third flip-flop 1042, etc.

Figure 11:
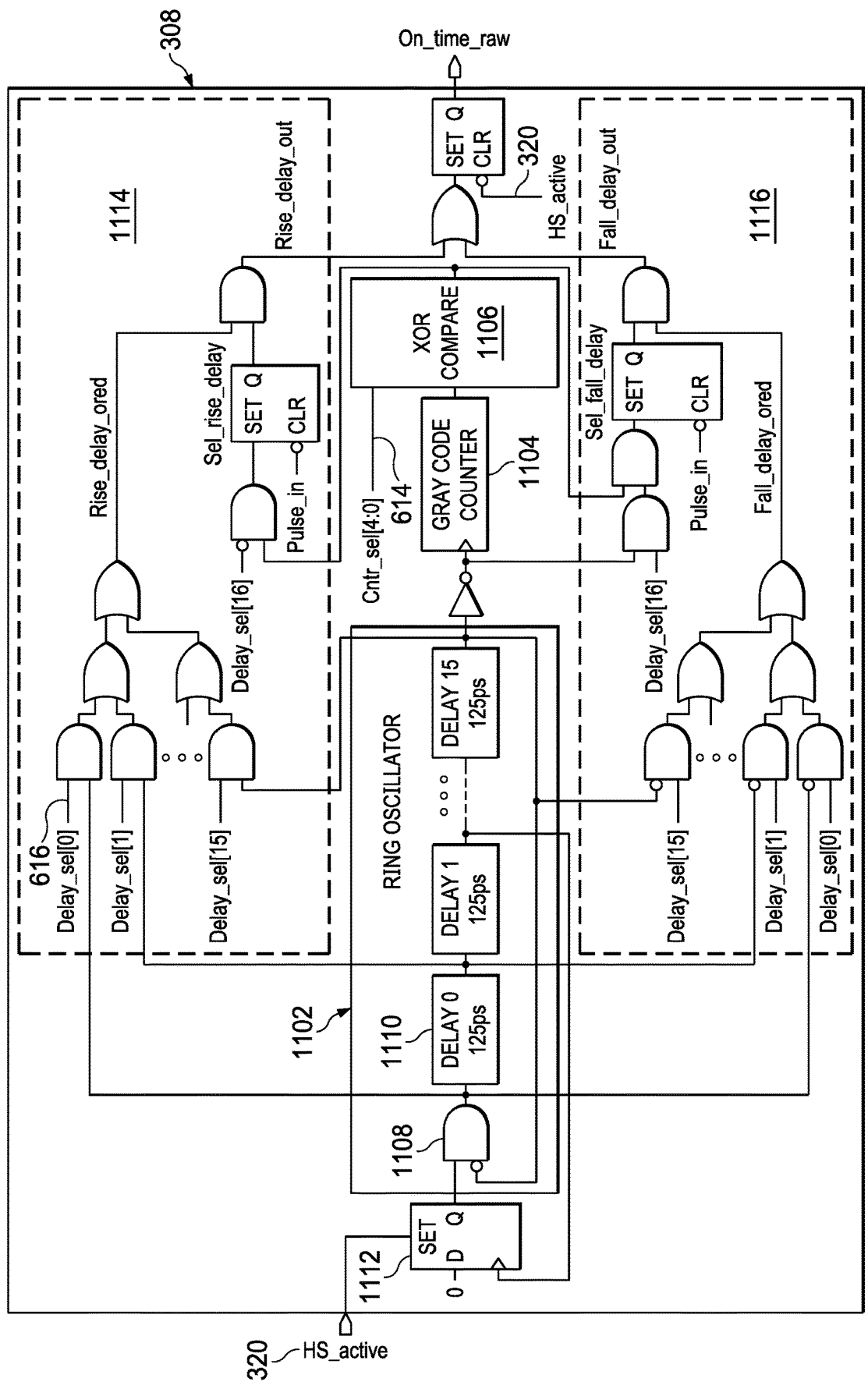
FIG. 11 is an example implementation of a first example pulse generator of the example digital ON-time generation system of FIGS. 3 and/or 6.

FIG. 11 is an example implementation of the first pulse generator 308 of the example digital OTG system 300 of FIGS. 3 and/or 6. The first pulse generator 308 generates a digitally controlled delay to a rising edge of the HS signal 320 of FIG. 3. For example, the first pulse generator 308 is triggered with a rising edge of the HS signal 320 and the output of the first pulse generator 308, the first time signal 328 of FIG. 3, latches after the digitally controlled delay has expired, where the digitally controlled delay is generated by the first pulse generator 308. In some examples, the first pulse generator 308 generates the digitally controlled delay in a range of 2 to 155 ns. Alternatively, the first pulse generator 308 may generate a delay using a different range. The first pulse generator 308 of FIG. 11 includes an example ring oscillator 1102, an example gray code counter 1104, and an example XOR compare 1106.

In FIG. 11, the XOR compare 1106 compares the coarse delay selection word 614 to an output of the gray code counter 1104. For example, the XOR compare 1106 XORs first bits included in the coarse delay selection word 614 at indices with second bits from the gray code counter 1104 at the same indices. The XOR compare 1106 generates a high signal when the coarse delay selection word 614 matches the output from the gray code counter 1104. In other words, the XOR compare 1106 generates a high output when the gray code counter 1104 counts up to a value that matches the value represented by the coarse delay selection word 614.

In the illustrated example of FIG. 11, the first pulse generator 308 includes the ring oscillator 1102 to generate a delay to be applied to the rising edge of the HS signal 320. The ring oscillator 1102 of FIG. 11 includes a first example logic gate 1108 and sixteen (16) example delay circuits 1110 coupled together in series. Each of the delay circuits 1110 correspond to a time delay of 125 ps. Alternatively, one or more of the delay circuits 1110 may correspond to a different time delay. The first logic gate 1108 outputs a high signal when a first example flip-flop 1112 latches a high signal to the output of the first flip-flop 1112 in response to the HS signal 320 enabling the first flip-flop 1112. For example, the first flip-flop 1112 outputs a high signal when the HS signal 320 enables the set input of the first flip-flop 1112. The first flip-flop 1112 is synchronously cleared (e.g., clocked synchronously to '0') to prevent glitches that can cause the ring oscillator 1102 to improperly function.

In the illustrated example of FIG. 11, the coarse delay selection word 614 and the accurate delay selection word 616 are decoded from the HS length 326 obtained from the digital filter 306 and synced to the HS signal 320 in the pulse control and data synchronizer 612 of FIG. 6. In FIG. 11, the coarse delay selection word 614 selects a quantity of rounds the ring oscillator 1102 needs to run before the HS signal 320 is passed through the accurate selection architecture depicted as a first example delay selection network 1114 and a second example delay selection network 1116.

The first delay selection network 1114 of FIG. 11 includes a plurality of logic gates (e.g., AND gates, OR gates, etc.) that are selected with bits of the accurate delay selection word 616. For example, delay_sel[15:0] can select where the HS signal 320 can be taken out from the delay line of the ring oscillator 1102. The first delay selection network 1114 determines a time delay that can be applied to a rising edge of the HS signal 320. For example, delay_sel[16] in the first delay selection network 1114 can select that the rising edge can be taken out from the delay line of the ring oscillator 1102.

The second delay selection network 1116 of FIG. 11 includes a plurality of logic gates (e.g., AND gates, OR gates, etc.) that are selected with bits of the accurate delay selection word 616. For example, delay_sel[15:0] can select where the HS signal 320 can be taken out from the delay line of the ring oscillator 1102. The second delay selection network 1116 determines a time delay that can be applied to a falling edge of the HS signal 320. For example, delay_sel[16] in the second delay selection network 1116 can select that the falling edge can be taken out from the delay line of the ring oscillator 1102.

In some examples, the gray code counter 1104 of FIG. 11 is used to build a first-in, first-out (FIFO) data buffer that has read and write ports that exist in different clock domains. The input and output counters included in the dual-port FIFO of the gray code counter 1104 are stored using Gray code to prevent invalid transient states from being captured when the count crosses clock domains. The gray code counter 1104 implements a system of binary counting in which only one digit changes each time one or more of the counters included in the gray code counter 1104 are updated.

In some examples, the gray code counter 1104 of FIG. 11 is used to overcome deficiencies in prior binary counters. For example, prior binary counters may be incorrect for a (relatively) short duration when a new output is clocked due to settling time differences of different bits of the output data. In such examples, the prior binary counters may be incorrect when more than one bit changes. For example, when an output changes from 0011 to 0100, there may be a 0101 at the output for the (relatively) short duration. The XOR compare 1106 may trigger if the incorrect momentary value matches the coarse delay selection word 614. As the output of the XOR compare 1106 is used asynchronously, one or more of the latches coupled to the XOR compare 1106 may be incorrectly set. To overcome such a deficiency of prior binary counters, the gray code counter 1104 is used, where the output of the gray code counter 1104 differs only be one bit at a time when the gray code counter 1104 counts and, thus, mitigates the potential of a momentary incorrect output value.

Figure 12:
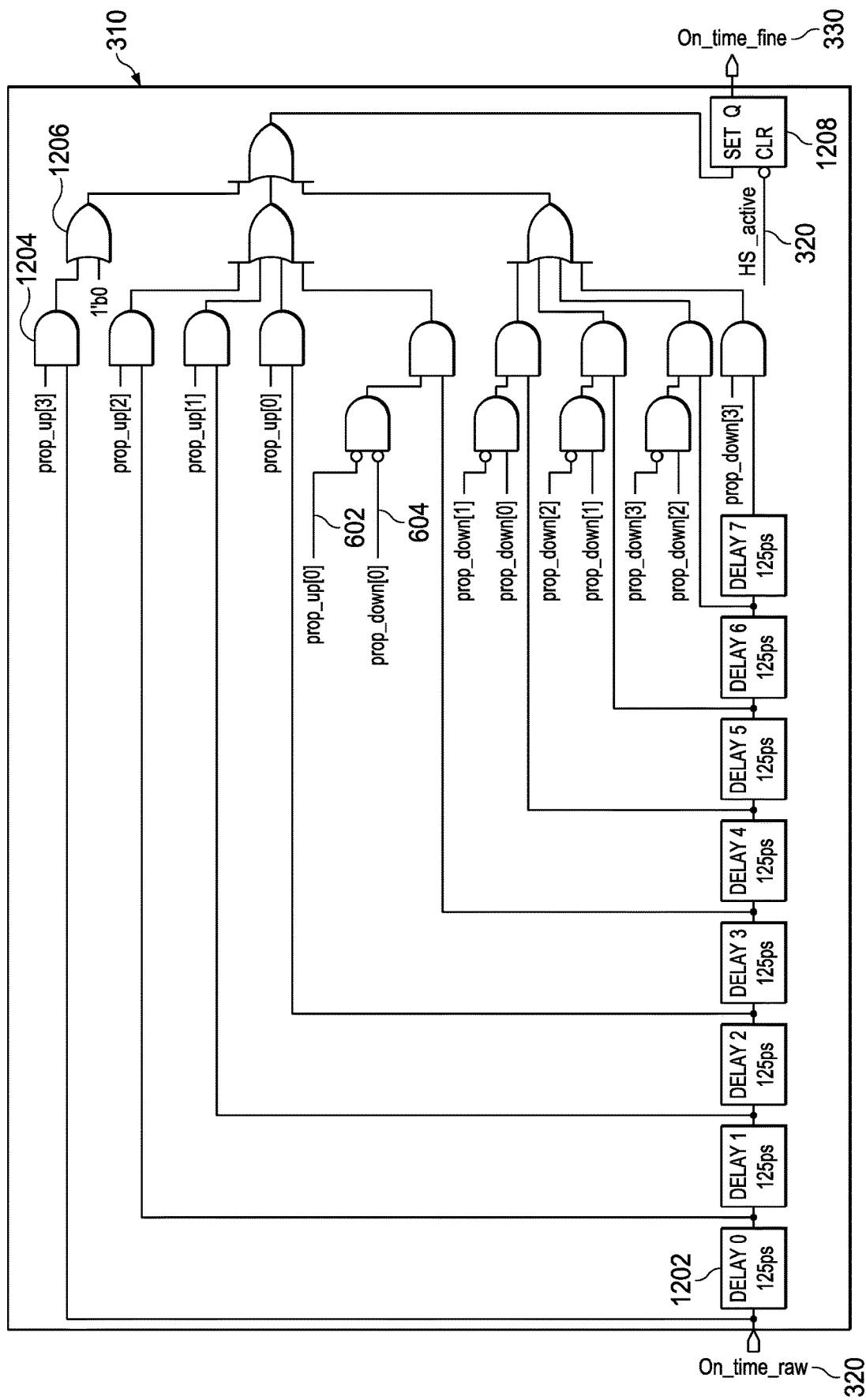
FIG. 12 is an example implementation of a second example pulse generator of the example digital ON-time generation system of FIGS. 3 and/or 6.

FIG. 12 is an example implementation of the second pulse generator 310 of the example digital OTG system 300 of FIGS. 3 and/or 6. The second pulse generator 310 tunes and/or otherwise adjusts the first time signal 328 generated by the first pulse generator 308. The second pulse generator 310 asynchronously delays the first time signal 328 based on the phase error determined by the PFD 302 of FIG. 3. In some examples, the second pulse generator 310 adjusts the delay of the first time signal 328 by +/−500 ps. Alternatively, the second pulse generator 310 may adjust the delay of the first time signal 328 by different values. In some examples, the total minimum delay generated by the first pulse generator 308 and the second pulse generator 310 is approximately 6 ns. Alternatively, the total minimum delay may be less than or greater than 6 ns.

In the illustrated example of FIG. 12, the second pulse generator 310 includes eight example delay circuits 1202, where each of the eight delay circuits 1202 correspond to 125 ps time delays. For example, the eight delay circuits 1202 can correspond to a set or a plurality of delay circuits. Alternatively, one or more of the eight delay circuits 1202 may correspond to different time delays. An output of each of the delay circuits 1202 are fed to example AND logic gates 1204. The AND logic gates 1204 are activated based on values of the prop up digital word 602 (e.g., the first delay adjustment word) and/or the prop down digital word 604 (e.g., the second delay adjustment word) generated by the TTD converter 304 of FIG. 3. The AND logic gates 1204 are coupled to example OR logic gates 1206. One of the OR logic gates 1206 is coupled to an example flip-flop 1208. The flip-flop 1208 of FIG. 12 is an SR flip-flop. Alternatively, the flip-flop 1208 may be a different type of flip-flop or latch. The flip-flop 1208 of FIG. 12 latches an input to an output of the flip-flop 1208 to generate the second time signal 330, where the second time signal 330 corresponds to an asynchronously determined time delay applied to the first time signal 328. For example, the second pulse generator 310 can determine a time delay in response to the TTD converter 304 generating the prop up digital word 602 and the prop down digital word 604 while the HS signal 320 is propagating through the digital OTG system 300

Figure 13:
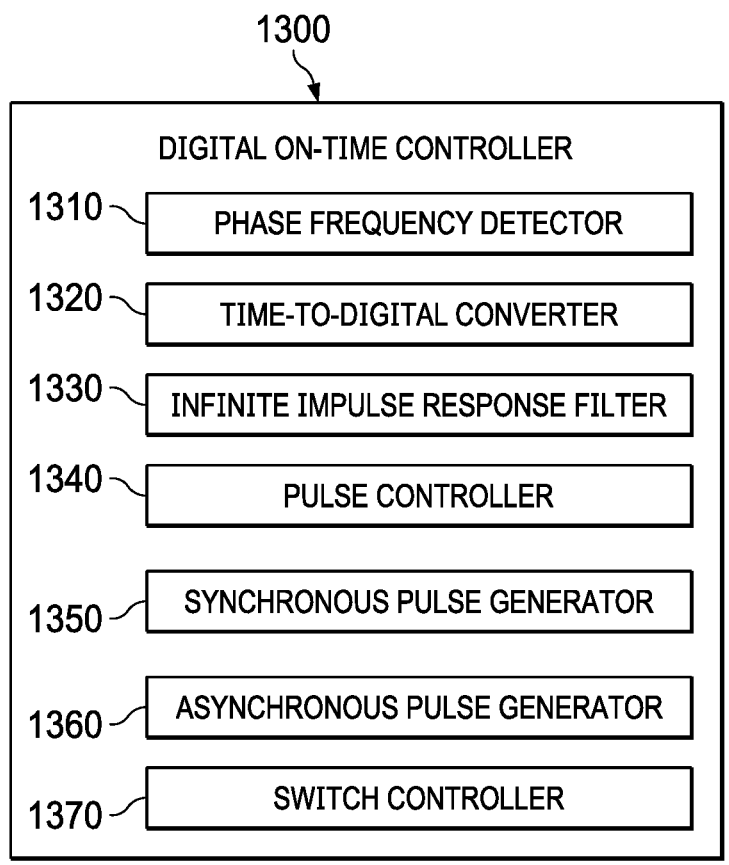
FIG. 13 is a block diagram of an example implementation of an example digital ON-time controller to implement the examples described herein.

FIG. 13 is a block diagram of an example implementation of an example digital ON-time controller 1300 to implement the examples described herein. The digital ON-time controller 1300 synchronizes switching operations of a power converter with a reference clock by adapting the ON-time of the power converter (e.g., the power converter 104 of FIG. 1). The digital ON-time controller 1300 adapts the ON-time of the power converter in response to detecting a phase difference between the reference clock and a HS signal that switches ON the power converter. The digital ON-time controller 1300 includes an example phase frequency detector 1310, an example time-to-digital converter 1320, an example infinite impulse response 1330, an example pulse controller 1340, an example synchronous pulse generator 1350, an example asynchronous pulse generator 1360, and an example switch controller 1370.

The digital ON-time controller 1300 includes the phase frequency detector 1310 to detect a phase difference between two signals. For example, the phase frequency detector 1310 can correspond to the PFD 302. For example, the phase frequency detector 1310 can detect a phase difference between the reference clock signal 318 of FIG. 3 and the HS signal 320 of FIG. 3. In some examples, the phase frequency detector 1310 includes means to determine whether the reference clock signal 318 has a higher frequency or a lower frequency than the HS signal 320. In some examples, the phase frequency detector 1310 includes means to determine a time difference between a first rising edge of a first signal and a second rising edge of a second signal. For example, the phase frequency detector 1310 can generate the up signal 314 or the down signal 316 based on the time difference between rising edges of the reference clock signal 318 and the HS signal 320.

The digital ON-time controller 1300 includes the time-to-digital converter 1320 to convert and/or otherwise translate a phase difference to one or more digital values. For example, the time-to-digital converter 1320 can correspond to the TTD converter 304. In some examples, the time-to-digital converter 1320 includes means to convert the phase difference determined by the phase frequency detector 1310 into one or more digital words. In some examples, the time-to-digital converter 1320 includes means to generate signals that can increase or decrease a switching frequency of a power converter. For example, the time-to-digital converter 1320 can generate the prop up digital word 602 and/or the prop down digital word 604 of FIG. 6. In some examples, the time-to-digital converter 1320 includes means to generate a signal corresponding to a digital value based on the phase difference. For example, the time-to-digital converter 1320 can generate the first PFD digital word 606 and the second PFD digital word 608 of FIG. 6.

The digital ON-time controller 1300 includes the infinite impulse response filter 1330 to synchronize and filter the digitalized phase error calculated and/or otherwise determined by the time-to-digital converter 1320. For example, the infinite impulse response filter 1330 can correspond to the digital filter 306. In some examples, the infinite impulse response filter 1330 includes means to generate a digital word corresponding to a length of a HS period of a power converter. For example, the infinite impulse response filter 1330 can generate the HS length 610 of FIG. 6 (e.g., Accumulator__1 1038 of FIG. 10).

The digital ON-time controller 1300 includes the pulse controller 1340 to control pulses and synchronize data processed by the synchronous pulse generator 1350. For example, the pulse controller 1340 can correspond to the pulse control and data synchronizer 612 of FIG. 6. In some examples, the pulse controller 1340 includes means to generate the coarse delay selection word (Cntr_sel[4:0]) 614 and the example accurate delay selection word (Delay_sel [16:0]) 616 of FIG. 6. In some examples, the pulse controller 1340 includes means to generate the words by decoding the HS length 610 of FIG. 6.

The digital ON-time controller 1300 includes the synchronous pulse generator 1350 to generate a first portion of an ON-time delay for a power converter. For example, the synchronous pulse generator 1350 can correspond to the first pulse generator 308. In some examples, the synchronous pulse generator 1350 includes means to generate a digitally controlled delay to a rising edge of an input signal. For example, the synchronous pulse generator 1350 can generate the first time signal 328 of FIG. 3.

The digital ON-time controller 1300 includes the asynchronous pulse generator 1360 to generate a second portion of the ON-time delay for a power converter. For example, the asynchronous pulse generator 1360 can correspond to the second pulse generator 310. In some examples, the asynchronous pulse generator 1360 includes means to generate a digitally controlled delay to a rising edge of an input signal. For example, the asynchronous pulse generator 1360 can generate the second time signal 330 of FIG. 3. In some examples, the asynchronous pulse generator 1360 includes means to tune and/or otherwise adjust the second portion of the ON-time delay generated by the synchronous pulse generator 1350 based on the phase difference determined by the phase frequency detector 1310. For example, the asynchronous pulse generator 1360 can adaptively determine the second portion of the ON-time delay while at least the synchronous pulse generator 1350 is determining the first portion of the ON-time delay in response to the phase frequency detector 1310 determining the phase difference between the reference clock signal and the HS signal.

The digital ON-time controller 1300 includes switch controller 1370 to manage a switching operation of a power converter. For example, the switch controller 1370 of FIG. 13 can correspond to the switch controller 618 of FIGS. 6 and/or 7. In some examples, the switch controller 1370 includes means to turn ON a high-side switch (e.g., the high-side switch 106 of FIG. 1) of a power converter (e.g., the converter 104 of FIG. 1). For example, the switch controller 1370 can generate the first buck converter signal 620 of FIG. 6. In some examples, the switch controller 1370 includes means to turn ON a low-side switch (e.g., the low-side switch 107 of FIG. 1) of the power converter. For example, the switch controller 1370 can generate the second buck converter signal 622 of FIG. 6. In some examples, the switch controller 1370 includes means to generate a signal to trigger a HS period of the power converter. For example, the switch controller 1370 can generate the HS signal 320 of FIG. 3.

While an example manner of implementing the digital ON-time controller 1300 is illustrated in FIG. 13, one or more of the elements, processes, and/or devices illustrated in FIG. 13 may be combined, divided, re-arranged, omitted, eliminated, and/or implemented in any other way. Further, the example phase frequency detector 1310, the example time-to-digital converter 1320, the example infinite impulse response 1330, the example pulse controller 1340, the example synchronous pulse generator 1350, the example asynchronous pulse generator 1360, the example switch controller 1370, and/or, more generally, the example digital ON-time controller 1300 of FIG. 13 may be implemented by hardware, software, firmware, and/or any combination of hardware, software, and/or firmware. Thus, for example, any of the example phase frequency detector 1310, the example time-to-digital converter 1320, the example infinite impulse response 1330, the example pulse controller 1340, the example synchronous pulse generator 1350, the example asynchronous pulse generator 1360, the example switch controller 1370, and/or, more generally, the example digital ON-time controller 1300 could be implemented by one or more analog or digital circuit(s), logic circuits, programmable processor(s), programmable controller(s), graphics processing unit(s) (GPU(s)), digital signal processor(s) (DSP(s)), application specific integrated circuit(s) (ASIC(s)), programmable logic device(s) (PLD(s)), and/or field programmable logic device(s) (FPLD(s)). When reading any of the apparatus or system claims of this patent to cover a purely software and/or firmware implementation, at least one of the example phase frequency detector 1310, the example time-to-digital converter 1320, the example infinite impulse response 1330, the example pulse controller 1340, the example synchronous pulse generator 1350, the example asynchronous pulse generator 1360, and/or the example switch controller 1370 is/are hereby expressly defined to include a non-transitory computer readable storage device or storage disk such as a memory, a digital versatile disk (DVD), a compact disk (CD), a Blu-ray disk, etc., including the software and/or firmware. Further still, the example digital ON-time controller 1300 of FIG. 13 may include one or more elements, processes, and/or devices in addition to, or instead of, those illustrated in FIG. 13, and/or may include more than one of any or all of the illustrated elements, processes, and devices.

Figure 14:
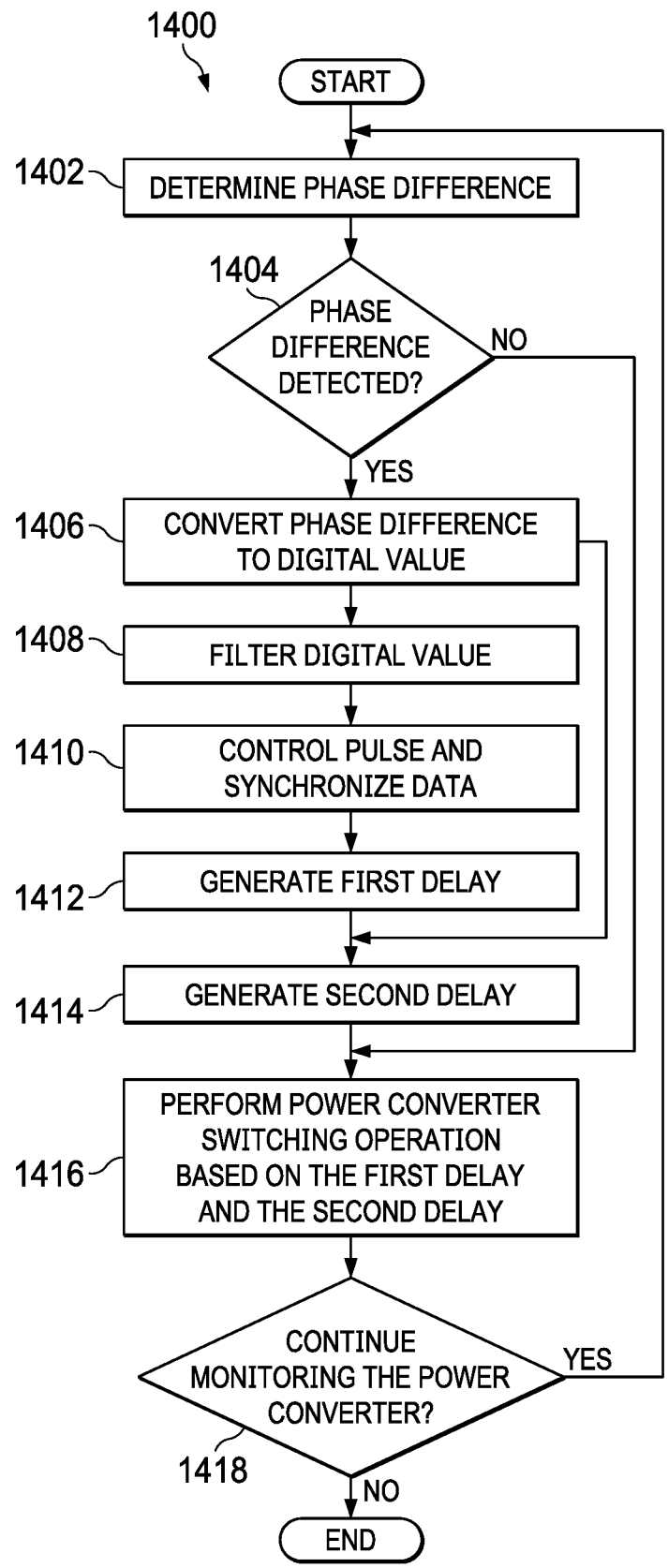
FIG. 14 is a flowchart representative of machine readable instructions that may be executed to implement the example controller of FIG. 13.

A flowchart representative of example hardware logic, machine readable instructions, hardware implemented state machines, and/or any combination thereof for implementing the digital ON-time controller 1300 of FIG. 13 is shown in FIG. 14. The machine readable instructions may be an executable program or portion of an executable program for execution by a computer processor such as the processor 1512 shown in the example processor platform 1500 described below in connection with FIG. 15. The program may be embodied in software stored on a non-transitory computer readable storage medium such as a CD-ROM, a floppy disk, a hard drive, a DVD, a Blu-ray disk, or a memory associated with the processor 1512, but the entire program and/or parts thereof could alternatively be executed by a device other than the processor 1512 and/or embodied in firmware or dedicated hardware. Further, although the example program is described with reference to the flowchart illustrated in FIG. 14, many other methods of implementing the example digital ON-time controller 1300 may alternatively be used. For example, the order of execution of the blocks may be changed, and/or some of the blocks described may be changed, eliminated, or combined. Additionally or alternatively, any or all of the blocks may be implemented by one or more hardware circuits (e.g., discrete and/or integrated analog and/or digital circuitry, an FPGA, an ASIC, a comparator, an operational-amplifier (op-amp), a logic circuit, etc.) structured to perform the corresponding operation without executing software or firmware.

As described above, the example process of FIG. 13 may be implemented using executable instructions (e.g., computer and/or machine readable instructions) stored on a non-transitory computer and/or machine readable medium such as a hard disk drive, a flash memory, a read-only memory, a compact disk, a digital versatile disk, a cache, a random-access memory, and/or any other storage device or storage disk in which information is stored for any duration (e.g., for extended time periods, permanently, for brief instances, for temporarily buffering, and/or for caching of the information). As used herein, the term non-transitory computer readable medium is expressly defined to include any type of computer readable storage device and/or storage disk and to exclude propagating signals and to exclude transmission media.

FIG. 14 is a flowchart representative of machine readable instructions 1400 that may be executed to implement the digital ON-time controller 1300 of FIG. 13. The machine readable instructions 1400 begin at block 1402, at which the digital ON-time controller 1300 determines a phase difference. For example, the phase frequency detector 1310 can determine a phase difference between the reference clock signal 318 and the HS signal 320 of FIG. 3.

At block 1404, the digital ON-time controller 1300 determines whether a phase difference is detected. For example, the phase frequency detector 1310 can determine that a phase difference is detected based on HS signal 320 having a higher frequency than the reference clock signal 318. In other examples, the phase frequency detector 1310 can determine that a reference clock and the switching frequency of the converter 104 of FIG. 1 are synchronized based on the reference clock signal 318 having (substantially) the same frequency as the HS signal 320.

If, at block 1404, the digital ON-time controller 1300 determines that a phase difference is not detected, control proceeds to block 1416 to perform a power converter switching operation. If, at block 1404, the digital ON-time controller 1300 determines that a phase difference is detected, then, at block 1406, the digital ON-time controller 1300 converts the phase difference to a digital value. For example, the time-to-digital converter 1320 can convert the phase difference corresponding to the up signal 314 or the down signal 316 of FIG. 3 to at least one of the prop up digital word 602, the prop down digital word 604, the first PFD digital word 606, or the second PFD digital word 608 of FIG. 6.

In response to converting the phase difference to the digital value and/or otherwise detecting a phase difference between two clock signals, the digital ON-time controller 1300 filters the digital value at block 1408 and asynchronously generates a second delay at block 1414 (e.g., at substantially the same time).

At block 1408, the digital ON-time controller 1300 filters the digital value. For example, the infinite impulse response filter 1330 can filter at least one of the first PFD digital word 606 or the second PFD digital word 608 by generating the HS length 610 of FIG. 6.

At block 1410, the digital ON-time controller 1300 controls a pulse and synchronizes data. For example, the pulse controller 1340 can generate at least one of the coarse delay selection word 614 or the accurate delay selection word 616 of FIG. 6 based on the HS length 610.

At block 1412, the digital ON-time controller 1300 generates a first delay. For example, the synchronous pulse generator 1350 can generate the first time signal 328 based on at least one of the coarse delay selection word 614 or the accurate selection word 616. For example, the synchronous pulse generator 1350 can generate a first portion (e.g., a substantial portion, a majority portion, etc.) of the ON-time delay for the converter 104 of FIG. 1.

At block 1414, the digital ON-time controller 1300 generates a second delay. For example, the asynchronous pulse generator 1360 can generate the second time signal 330 based on at least one of the prop up digital word 602, the prop down digital word 604, or the first time signal 328. For example, the asynchronous pulse generator 1360 can generate a second portion (e.g., a substantially less portion, a minority portion, etc.) of the ON-time delay for the converter 104 of FIG. 1. In such examples, the asynchronous pulse generator 1360 can asynchronously generate a time delay associated with the HS signal 320 of FIG. 3 when the phase frequency detector 1310 detects and/or otherwise determines a phase difference between the reference clock signal 318 and the HS signal 320.

At block 1416, the digital ON-time controller 1300 performs a power converter switching operation based on the first delay and the second delay. For example, the switch controller 1370 can generate the HS signal 320 based on the first time signal 328 and the second time signal 330. In such examples, the switch controller 1370 can generate the HS signal 320, where the rising edge of the HS signal 320 is delayed by a quantity of time associated with a time delay corresponding to the first time signal 328 and the second time signal 330. In such examples, the switch controller 1370 can direct and/or otherwise instruct the control logic 109 of FIG. 1 to switch OFF the high-side switch 106 of FIG. 1 after a time delay corresponding to the first time signal 328 and the second time signal 330, which ends the HS period.

At block 1418, the digital ON-time controller 1300 determines whether to continue monitoring the power converter. For example, the phase frequency detector 1310 can determine to continue monitoring the reference clock signal 318 and the HS signal 320 for a phase difference. If, at block, 1418, the digital ON-time controller 1300 determines to continue monitoring the power converter, control returns to block 1402 to determine a phase difference, otherwise the machine readable instructions 1400 of FIG. 14 conclude.

Figure 15:
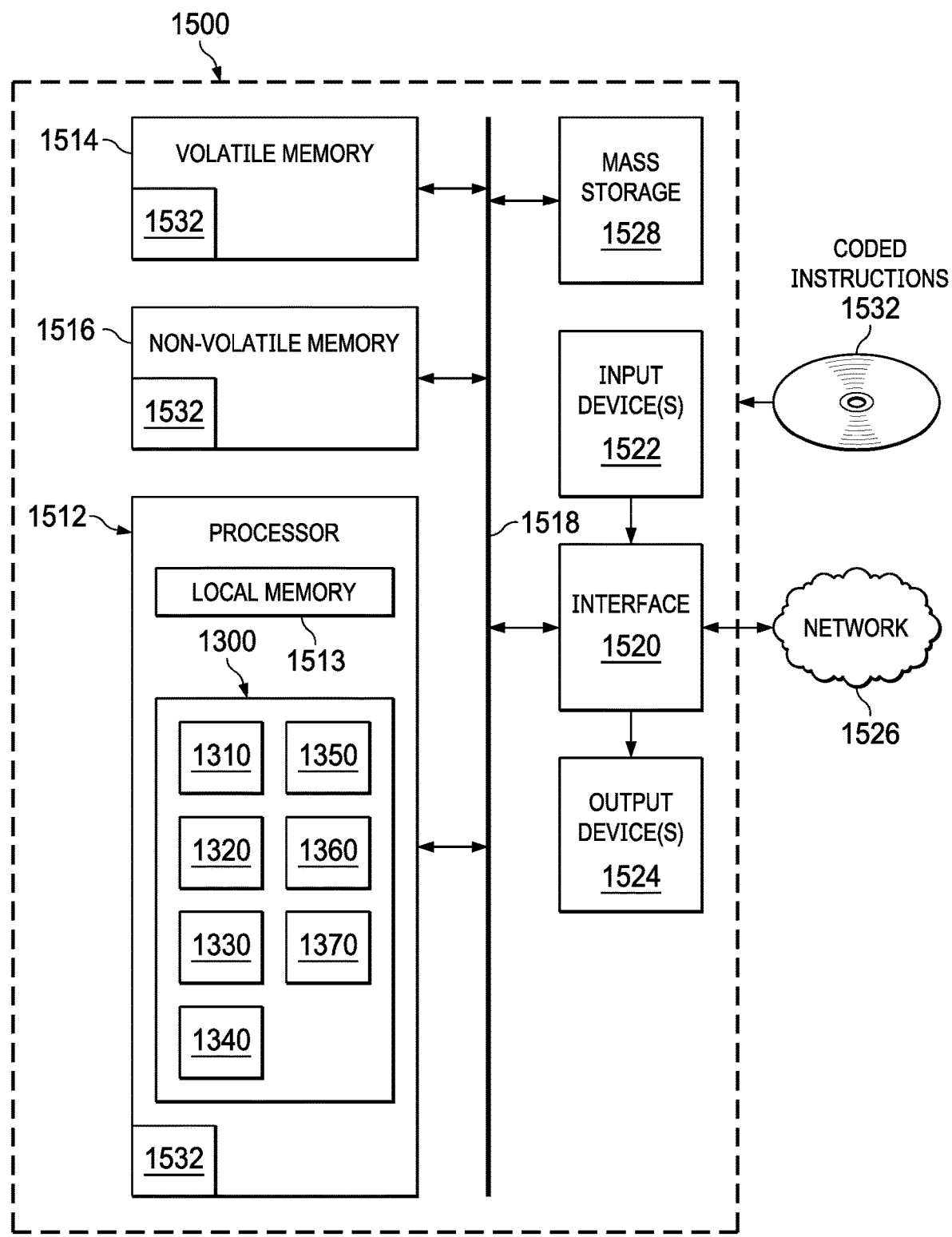
FIG. 15 is a block diagram of an example processing platform structured to execute the instructions of FIG. 14 to implement the example controller of FIG. 13.

FIG. 15 is a block diagram of an example processor platform 1500 structured to execute the instructions of FIG. 14 to implement the digital ON-time controller 1300 of FIG. 13. The processor platform 1500 can be, for example, a server, a personal computer, a workstation, a self-learning machine (e.g., a neural network), a mobile device (e.g., a cell phone, a smart phone, a tablet such as an iPad™), a personal digital assistant (PDA), an Internet appliance, a DVD player, a CD player, a digital video recorder, a Blu-ray player, a gaming console, a personal video recorder, a set top box, a headset or other wearable device, or any other type of computing device.

The processor platform 1500 of the illustrated example includes a processor 1512. The processor 1512 of the illustrated example is hardware. For example, the processor 1512 can be implemented by one or more integrated circuits, logic circuits, microprocessors, GPUs, DSPs, or controllers from any desired family or manufacturer. The hardware processor may be a semiconductor based (e.g., silicon based) device. In this example, the processor 1512 implements the example phase frequency detector 1310, the example time-to-digital converter 1320, the example infinite impulse response 1330, the example pulse controller 1340, the example synchronous pulse generator 1350, the example asynchronous pulse generator 1360, and the example switch controller 1370 of FIG. 13.

The processor 1512 of the illustrated example includes a local memory 1513 (e.g., a cache). The processor 1512 of the illustrated example is in communication with a main memory including a volatile memory 1514 and a non-volatile memory 1516 via a bus 1518. The volatile memory 1514 may be implemented by Synchronous Dynamic Random Access Memory (SDRAM), Dynamic Random Access Memory (DRAM), RAMBUS® Dynamic Random Access Memory (RDRAM®), and/or any other type of random access memory device. The non-volatile memory 1516 may be implemented by flash memory and/or any other desired type of memory device. Access to the main memory 1514, 1516 is controlled by a memory controller.

The processor platform 1500 of the illustrated example also includes an interface circuit 1520. The interface circuit 1520 may be implemented by any type of interface standard, such as an Ethernet interface, a universal serial bus (USB), a Bluetooth® interface, a near field communication (NFC) interface, and/or a PCI express interface.

In the illustrated example, one or more input devices 1522 are connected to the interface circuit 1520. The input device(s) 1522 permit(s) a user to enter data and/or commands into the processor 1512. The input device(s) 1522 can be implemented by, for example, an audio sensor, a microphone, a camera (still or video), a keyboard, a button, a mouse, a touchscreen, a track-pad, a trackball, an isopoint device, and/or a voice recognition system.

One or more output devices 1524 are also connected to the interface circuit 1520 of the illustrated example. The output devices 1524 can be implemented, for example, by display devices (e.g., a light emitting diode (LED), an organic light emitting diode (OLED), a liquid crystal display (LCD), a cathode ray tube display (CRT), an in-place switching (IPS) display, a touchscreen, etc.), a tactile output device, a printer, and/or speaker. Accordingly, the interface circuit 1520 of the illustrated example usually includes a graphics driver card, a graphics driver chip, and/or a graphics driver processor.

The interface circuit 1520 of the illustrated example also includes a communication device such as a transmitter, a receiver, a transceiver, a modem, a residential gateway, a wireless access point, and/or a network interface to facilitate exchange of data with external machines (e.g., computing devices of any kind) via a network 1526. The communication can be via, for example, an Ethernet connection, a digital subscriber line (DSL) connection, a telephone line connection, a coaxial cable system, a satellite system, a line-of-site wireless system, a cellular telephone system, etc.

The processor platform 1500 of the illustrated example also includes one or more mass storage devices 1528 for storing software and/or data. Examples of such mass storage devices 1528 include floppy disk drives, hard drive disks, compact disk drives, Blu-ray disk drives, redundant array of independent disks (RAID) systems, and digital versatile disk (DVD) drives.

The machine executable instructions 1532 of FIG. 14 may be stored in the mass storage device 1528, in the volatile memory 1514, in the non-volatile memory 1516, and/or on a removable non-transitory computer readable storage medium such as a CD or DVD.

In this description, example systems, methods, apparatus, and articles of manufacture are described that improve power converter operation by facilitating low-latency digital ON-time and/or OFF-time generation. The described systems, methods, apparatus, and articles of manufacture generate the ON-time for a power converter fully digitally with digital current leakage (e.g., only digital current leakage) and without startup times. The described systems, methods, apparatus, and articles of manufacture generate the ON-time for either a high-side period or a low-side period of the power converter. The described systems, methods, apparatus, and articles of manufacture synchronize switching of a power converter to a reference clock by adapting the ON-time with an all-digital PLL and without a gigahertz frequency clock by coupling at least two pulse generators in series, where one of the pulse generators is controlled asynchronously. The described systems, methods, apparatus, and articles of manufacture controls one of the pulse generators asynchronously to adapt a small portion of the HS period during the ON-time based on a detected phase difference in the beginning of the HS period.

The following pertain to further examples described herein.

Example 1 includes apparatus comprising a phase frequency detector to determine a phase difference between a first signal and a second signal, a first pulse generator to generate a first time signal at a second time, the first time signal associated with a first time delay based on the phase difference, and a second pulse generator coupled to the first pulse generator to generate a second time signal at a third time, the third time after the second time, the second pulse generator to obtain a digital word based on the phase difference at a first time, the first time before the second time and the third time, the second time signal associated with a second time delay based on the phase difference.

Example 2 includes the apparatus of example 1, wherein the phase frequency detector determines the phase difference by comparing a first frequency of the first signal to a second frequency of the second signal, the first signal generated by a reference clock, the second signal to trigger a high-side period or a low-side period of a power converter.

Example 3 includes the apparatus of example 1, further including a time-to-digital converter coupled to the phase frequency detector to convert the phase difference to a digital word, and a digital filter coupled to the time-to-digital converter and the first pulse generator to determine a filtered phase difference based on the phase difference, and generate a pulse based on the filtered phase difference, the pulse having a delay corresponding to a high-side period or a low-side period of a power converter, the delay of the pulse based on the digital word.

Example 4 includes the apparatus of example 3, wherein the digital word is a first digital word, and the time-to-digital converter is to transmit the first digital word to the digital filter, generate a second digital word, and transmit the second digital word to the second pulse generator to generate the second time signal.

Example 5 includes the apparatus of example 1, further including a latch coupled to a power stage, the latch to output a high-side signal or a low-side signal based on the second time signal, the power stage including at least one of a high-side switch or a low-side switch coupled to a power converter.

Example 6 includes the apparatus of example 5, wherein the latch is to output the high-side signal or the low-side signal when a third signal from a comparator corresponds to a high signal.

Example 7 includes the apparatus of example 1, wherein the second pulse generator includes one or more delay circuits to generate the second time delay, one or more logic gates coupled to ones of the one or more delay circuits, the one or more logic gates to generate an output based on a delay adjustment word, and a latch to output the second time signal based on the second time delay.

Example 8 includes an apparatus, comprising a first pulse generator coupled to a second pulse generator in series, an output of the first pulse generator coupled to an input of the second pulse generator, a latch coupled to the second pulse generator, an input of the latch coupled to an output of the second pulse generator, an output of the latch coupled to an input of the first pulse generator and an input of a phase frequency detector, and a converter coupled to the output of the latch.

Example 9 includes the apparatus of example 8, wherein the first pulse generator includes a ring oscillator coupled to a gray code counter, an XOR compare coupled to the gray code counter, a first latch coupled to the XOR compare via a first logic gate, a second latch coupled to the XOR compare via a second logic gate, and a third latch coupled to: (a) the first latch via a third logic gate and a fourth logic gate; and (b) the second latch via the fourth logic gate and a fifth logic gate.

Example 10 includes the apparatus of example 8, wherein the latch is a first latch, and the second pulse generator includes a set of delay circuits including a first delay circuit coupled in series to a second delay circuit, a first set of logic gates coupled to the set of delay circuits, and a second set of logic gates coupled to the first set of logic gates and a second latch.

Example 11 includes the apparatus of example 8, wherein the phase frequency detector is coupled to a time-to-digital converter, an output of the phase frequency detector coupled to an input of the time-to-digital converter, and further including a digital filter coupled to the first pulse generator and the time-to-digital converter, an output of the digital filter coupled to an input of the first pulse generator and an input to the time-to-digital converter.

Example 12 includes the apparatus of example 8, wherein the converter includes a power stage, the power stage including control logic coupled to a high-side switch and a low-side switch.

Example 13 includes the apparatus of example 8, wherein the converter is a buck converter, a boost converter, or a buck-boost converter.

Example 14 includes a method comprising determining a phase difference between a first signal and a second signal at a first time, converting the phase difference to a digital word at a second time, transmitting the digital word to a second pulse generator coupled to a first pulse generator at a third time, generating, with the first pulse generator, a first time signal at a fourth time, the first time signal associated with a first time delay, the fourth time after the third time, and generating, with the second pulse generator, a second time signal at a fifth time, the second time signal associated with a second time delay, the fifth time after the fourth time, the second time signal based on the digital word obtained at the third time.

Example 15 includes the method of example 14, wherein determining the phase difference includes comparing a first frequency of the first signal to a second frequency of the second signal, the first signal generated by a reference clock, the second signal to end a high-side period or a low-side period of a converter.

Example 16 includes the method of example 14, further including generating, with a digital filter, a pulse having a length corresponding to a high-side period or a low-side period of a power converter, the length of the pulse based on the digital word.

Example 17 includes the method of example 16, wherein the digital word is a second digital word, further including generating a first digital word, transmitting the first digital word to the digital filter, and transmitting the second digital word to the second pulse generator to generate the second time signal based on receiving the second digital word before the first pulse generator generates the pulse.

Example 18 includes the method of example 14, further including outputting, with a latch, a high-side signal or a low-side signal to a converter based on the second time signal, the converter including a power stage including a high-side switch coupled to a low-side switch.

Example 19 includes the method of example 18, wherein the latch is to output the high-side signal or the low-side signal when a third signal from a comparator corresponds to a high signal.

Example 20 includes the method of example 14, wherein the digital word is a first digital word, further including transmitting the first digital word to the second pulse generator when the phase difference indicates that the first signal has a first frequency greater than a second frequency of the second signal, the second pulse generator is to reduce the first frequency based on the first digital word, and transmit a second digital word to the second pulse generator when the phase difference indicates that the first frequency is less than the second frequency, the second pulse generator is to increase the first frequency based on the second digital word.

Modifications are possible in the described embodiments, and other embodiments are possible, within the scope of the claims.

What is claimed is:

1. An apparatus comprising:
   a phase frequency detector to determine a phase difference between a first signal and a second signal;
   a first pulse generator to generate a first time signal at a second time, the first time signal associated with a first time delay based on the phase difference; and
   a second pulse generator coupled to the first pulse generator to generate a second time signal at a third time, the third time after the second time, the second pulse generator to obtain a digital word based on the phase difference at a first time, the first time before the second time and the third time, the second time signal associated with a second time delay based on the phase difference.

2. The apparatus of claim 1, wherein the phase frequency detector determines the phase difference by comparing a first frequency of the first signal to a second frequency of the second signal, the first signal generated by a reference clock, the second signal to trigger a high-side period or a low-side period of a power converter.

3. The apparatus of claim 1, further including:
   a time-to-digital converter coupled to the phase frequency detector to convert the phase difference to a digital word; and
   a digital filter coupled to the time-to-digital converter and the first pulse generator to:
      determine a filtered phase difference based on the phase difference; and
      generate a pulse based on the filtered phase difference, the pulse having a delay corresponding to a high-side period or a low-side period of a power converter, the delay of the pulse based on the digital word.

4. The apparatus of claim 3, wherein the digital word is a first digital word, and the time-to-digital converter is to:
   transmit the first digital word to the digital filter;
   generate a second digital word; and
   transmit the second digital word to the second pulse generator to generate the second time signal.

5. The apparatus of claim 1, further including a latch coupled to a power stage, the latch to output a high-side signal or a low-side signal based on the second time signal, the power stage including at least one of a high-side switch or a low-side switch coupled to a power converter.

6. The apparatus of claim 5, wherein the latch is to output the high-side signal or the low-side signal when a third signal from a comparator corresponds to a high signal.

7. The apparatus of claim 1, wherein the second pulse generator includes:
   one or more delay circuits to generate the second time delay;
   one or more logic gates coupled to ones of the one or more delay circuits, the one or more logic gates to generate an output based on a delay adjustment word; and
   a latch to output the second time signal based on the second time delay.

8. An apparatus, comprising:
   a first pulse generator coupled to a second pulse generator in series, an output of the first pulse generator coupled to an input of the second pulse generator;
   a latch coupled to the second pulse generator, an input of the latch coupled to an output of the second pulse generator, an output of the latch coupled to an input of the first pulse generator and an input of a phase frequency detector; and
   a converter coupled to the output of the latch.

9. The apparatus of claim 8, wherein the first pulse generator includes:
   a ring oscillator coupled to a gray code counter;
   an XOR compare coupled to the gray code counter;
   a first latch coupled to the XOR compare via a first logic gate;
   a second latch coupled to the XOR compare via a second logic gate; and
   a third latch coupled to (1) the first latch via a third logic gate and a fourth logic gate and (2) the second latch via the fourth logic gate and a fifth logic gate.

10. The apparatus of claim 8, wherein the latch is a first latch, and the second pulse generator includes:
   a set of delay circuits including a first delay circuit coupled in series to a second delay circuit;
   a first set of logic gates coupled to the set of delay circuits; and
   a second set of logic gates coupled to the first set of logic gates and a second latch.

11. The apparatus of claim 8, wherein the phase frequency detector is coupled to a time-to-digital converter, an output of the phase frequency detector coupled to an input of the time-to-digital converter, and further including a digital filter coupled to the first pulse generator and the time-to-digital converter, an output of the digital filter coupled to an input of the first pulse generator and an input to the time-to-digital converter.

12. The apparatus of claim 8, wherein the converter includes a power stage, the power stage including control logic coupled to a high-side switch and a low-side switch.

13. The apparatus of claim 8, wherein the converter is a buck converter, a boost converter, or a buck-boost converter.

14. A method comprising:
   determining a phase difference between a first signal and a second signal at a first time;
   converting the phase difference to a digital word at a second time;
   transmitting the digital word to a second pulse generator coupled to a first pulse generator at a third time;
   generating, with the first pulse generator, a first time signal at a fourth time, the first time signal associated with a first time delay, the fourth time after the third time; and
   generating, with the second pulse generator, a second time signal at a fifth time, the second time signal associated with a second time delay, the fifth time after the fourth time, the second time signal based on the digital word obtained at the third time.

15. The method of claim 14, wherein determining the phase difference includes comparing a first frequency of the first signal to a second frequency of the second signal, the first signal generated by a reference clock, the second signal to end a high-side period or a low-side period of a converter.

16. The method of claim 14, further including generating, with a digital filter, a pulse having a length corresponding to a high-side period or a low-side period of a power converter, the length of the pulse based on the digital word.

17. The method of claim 16, wherein the digital word is a second digital word, further including:
   generating a first digital word;
   transmitting the first digital word to the digital filter; and
   transmitting the second digital word to the second pulse generator to generate the second time signal based on receiving the second digital word before the first pulse generator generates the pulse.

18. The method of claim 14, further including outputting, with a latch, a high-side signal or a low-side signal to a converter based on the second time signal, the converter including a power stage including a high-side switch coupled to a low-side switch.

19. The method of claim 18, wherein the latch is to output the high-side signal or the low-side signal when a third signal from a comparator corresponds to a high signal.

20. The method of claim 14, wherein the digital word is a first digital word, further including:
   transmitting the first digital word to the second pulse generator when the phase difference indicates that the first signal has a first frequency greater than a second frequency of the second signal, the second pulse generator is to reduce the first frequency based on the first digital word; and
   transmit a second digital word to the second pulse generator when the phase difference indicates that the first frequency is less than the second frequency, the second pulse generator is to increase the first frequency based on the second digital word.

\* \* \* \* \*